United States Patent [19]

Miyakawa et al.

[11] Patent Number: 5,717,598
[45] Date of Patent: Feb. 10, 1998

[54] AUTOMATIC MANUFACTURABILITY EVALUATION METHOD AND SYSTEM

[75] Inventors: Seii Miyakawa, Yokohama; Syoji Arimoto, Kamakura; Manabu Ikeda, deceased, late of Yokohama, Shoko Ikeda, heiress; Toshijiro Ohashi, Chigasaki; Minoru Iwata, Chiba; Mitsuharu Hayakawa, Konosu, all of Japan

[73] Assignee: Hitachi, Ltd., Tokyo, Japan

[21] Appl. No.: 532,980

[22] Filed: Sep. 22, 1995

Related U.S. Application Data

[63] Continuation-in-part of Ser. No. 861,302, Mar. 31, 1992, abandoned, Ser. No. 726,997, Jul. 8, 1991, abandoned, and Ser. No. 654,236, Feb. 12, 1991, abandoned, said Ser. No. 861,302, is a continuation-in-part of Ser. No. 726,997, which is a continuation-in-part of Ser. No. 654,236.

[30] Foreign Application Priority Data

| Feb. 14, 1990 | [JP] | Japan | 02-031583 |
| Jul. 11, 1990 | [JP] | Japan | 02-181393 |
| Apr. 4, 1991 | [JP] | Japan | 03-071488 |

[51] Int. Cl.$^6$ .................................................. G06F 19/00
[52] U.S. Cl. ........................ 364/468.09; 364/468.03
[58] Field of Search ................ 364/468.01, 468.02, 364/468.03, 468.09, 468.1, 474.24, 468.05–468.08; 395/207–211, 919

[56] References Cited

U.S. PATENT DOCUMENTS

| 5,058,026 | 10/1991 | Kunii | 364/468.09 |
| 5,208,765 | 5/1993 | Turnbull | 364/552 |
| 5,307,282 | 4/1994 | Conradson et al. | 364/468.09 |
| 5,442,563 | 8/1995 | Lee | 364/468.1 |
| 5,552,995 | 9/1996 | Sebastian | 364/468.03 |

OTHER PUBLICATIONS

"Kumitateyasui Sekkei (Design Easy to Implement)", Nikkei Mechanical, Mar. 21, 1988, pp. 37–48. (Provided in Japanese—no translation available).

"Meka Sekkei Jutsu (Mechanical Design Engineering)", Series III of Nikkei Mechanical, pp. 101–199. (Provided in Japanese—no translation available) Date unknown.

"Proc ASME International Computers in Engineering Conference", 1986, pp. 285–292. (Provided in English).

*Primary Examiner*—Joseph Ruggiero
*Attorney, Agent, or Firm*—Fay Sharpe Beall Fagan Minnich & McKee

[57] ABSTRACT

A designed object workability evaluating system for evaluating quantitatively at a stage of designing an article whether a structure of the article as designed can be realized easily in a manufacturing stage for thereby selectively determining a best structure from a plurality of design plans through comparative evaluation thereof. The system includes a client machine section including a guide information generating unit for generating information for guiding operations of a user, an input device for allowing the user to input commands and data and a display unit. A server machine section includes a registering unit storing evaluation elements defined by the user, an index calculating module for calculating indexes indicating degrees of difficulty/ease of work, an evaluation element estimating module, a part workability evaluation module, an article workability evaluation module, and a best design plan selection/determination module.

15 Claims, 28 Drawing Sheets

FIG.4

(Note) $a\varepsilon x = af1(aCx) = af11(aTx) = af12(aIx)$

| BASIC ELEMENTS (aX) | | | BASIC ELIMINATION SCORE ($a\varepsilon x$) (Note) | ATTACHING COST (aCx) | ATTACHING TIME (aTx) |
|---|---|---|---|---|---|
| NAME | SYMBOL (aX) | CONTENT | | | |
| ATTACHMENT BY DOWNWARD MOVEMENT | ↓ (aXo) | | 0 | yens 1.26 | min. 0.020 |
| ATTACHMENT BY HORIZONTAL MOVEMENT | → | | 5.2 | 1.89 | 0.025 |
| ATTACHMENT BY OBLIQUE UPWARD MOVEMENT | ╱ | MOVE PART LINEARLY UPWARDS OBLIQUELY | 7.8 | 2.21 | 0.027 |
| ATTACHMENT BY ROTATIONAL MOVEMENT | ↻ | DISPLACE PART ANGULARLY | 8.2 | 2.25 | 0.028 |
| SOLDERING | S | SOLDER / LEAD WIRE / PCB | | | |

FIG. 5

| NAME | SUPPLEMENTARY ELEMENTS (aX) | | | | SUPPLEMENTARY COEFFICIENT (aα) | | ATTACHMENT COST (aCx$X_n$) | |
|---|---|---|---|---|---|---|---|---|
| | SYMBOL (aX) | n | SYMBOL(aXn) | CLASSIFICATION | | | | |
| | | | | STATUS | NUMERICAL VALUE | SYMBOL(aα) | aX=↓ | aX=→ |
| MAXIMUM SIZE | $\ell$ | 1 | $\ell_1 = \ell_0$ | $0 \leq |$MAXIMUM SIZE$| \leq S_1$ | 1.0 | $\lambda_\ell$ | 1.26 yen | 1.89 yen |
| | | 2 | $\ell_2$ | $S_1 \leq |$MAXIMUM SIZE$| \leq S_2$ | $a_{10}(|$MAXIMUM SIZE$|-S_1)+1.0$ | | (1.51) | (2.27) |
| | | 3 | $\ell_3$ | $S_2 \leq |$MAXIMUM SIZE$| \leq S_3$ | $a_{11}(|$MAXIMUM SIZE$|-S_2)+b_{11}$ | | | |
| | | --- | | | | | | |
| MASS (WEIGHT) | m | 1 | $m_1 = m_0$ | $0 \leq |$MASS (WEIGHT)$| \leq S_4$ | 1.0 | $\lambda_m$ | 1.26 | 1.89 |
| | | 2 | $m_2$ | $S_4 \leq |$MASS (WEIGHT)$| \leq S_5$ | $a_{12}(|$MASS (WEIGHT)$|-S_4)+1.0$ | | (1.59) | (2.38) |
| | | 3 | $m_3$ | $S_5 \leq |$MASS (WEIGHT)$| \leq S_6$ | $a_{13}(|$MASS (WEIGHT)$|-S_5)+b_{12}$ | | | |
| | | --- | | | | | | |
| GEOMETRICAL ACCURACY | P | 1 | $P_1 = P_0$ | OPENED HOLE | 1.0 | θ | 1.26 | 1.89 |
| | | 2 | $P_2$ | HOLE WITH LOOSENESS D>1.1d | 1.1 | | 1.39 | 2.08 |
| | | 3 | $P_3$ | TIGHT HOLE D≦3mm | 1.22 | | 1.54 | 2.31 |
| | | 4 | $P_4$ | PLURAL HOLES n HOLES | 1.46 | | 1.84 | 2.76 |
| | | --- | | | | | | |

FIG.6
(Note) $m\varepsilon x = mf1(mCx) = mf11(mTx) = mf21(mIx)$
| BASIC ELEMENTS (mX) | | | BASIC ELIMINA-TION SCORE ($m\varepsilon x$) (Note) | PROCESS COST (mCx) | PROCESS TIME (mTx) |
|---|---|---|---|---|---|
| NAME | SYMBOL (mX) | CONTENT | | | |
| PLANAR SURFACE (Plane) | P (mXo) | 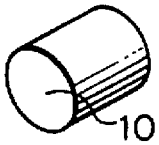 10 | 0 | 126 yens | 2 min. |
| CYLINDRICAL SURFACE (Cylinder) | C | 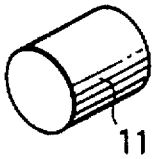 11 | 2 | 189 yens | 3 min. |
| ROUND BORE SURFACE (Round Hole) | RH | 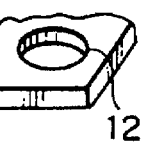 12 | | | |

FIG. 7

(Note) NUMERIC VALUE: $m\alpha_n = \left[\dfrac{mCxXn}{mCx}\right] \times \text{mean}$

| NAME | SYMBOL (x) | SUPPLEMENTARY ELEMENTS (mX) | | | SUPPLEMENTARY COEFFICIENT NUMERIC VALUE ($m\alpha$) | | PROCESS COST (mCxXn) | |
|---|---|---|---|---|---|---|---|---|
| | | n | SYMBOL (mXn) | CLASSIFICATION | | | | |
| | | | | CONTENT | NUMERIC VALUE (Note) ($m\alpha n$) | SYMBOL ($m^\alpha$) | mX = P | mX = C |
| MATERIAL | m | 1 | m1 = s | STEEL (mo) | 1.0 | $\rho$ | 126 yens | 189 yens |
| | | 2 | m2 = a | ALUMINUM ALLOY | 0.92 | | 107 | 174 |
| | | 3 | --- | | | | | |
| FINISHING PRECISION | a | 1 | a1 = a2 | ROUGH ▽ | 1.0 | $\mu$ | 126 | 189 |
| | | 2 | a2 | MODERATE ▽▽ | 1.31 | | 165 | 242 |
| | | 3 | a3 | FINE ▽▽▽ | 1.68 | | | |
| | | 4 | --- | | | | | |
| SIZE | $\ell$ | 1 | $\ell_1 = \ell_0$ | | 1.0 | $\lambda$ | 126 | 189 |
| | | 2 | $\ell_2$ | | | | | |

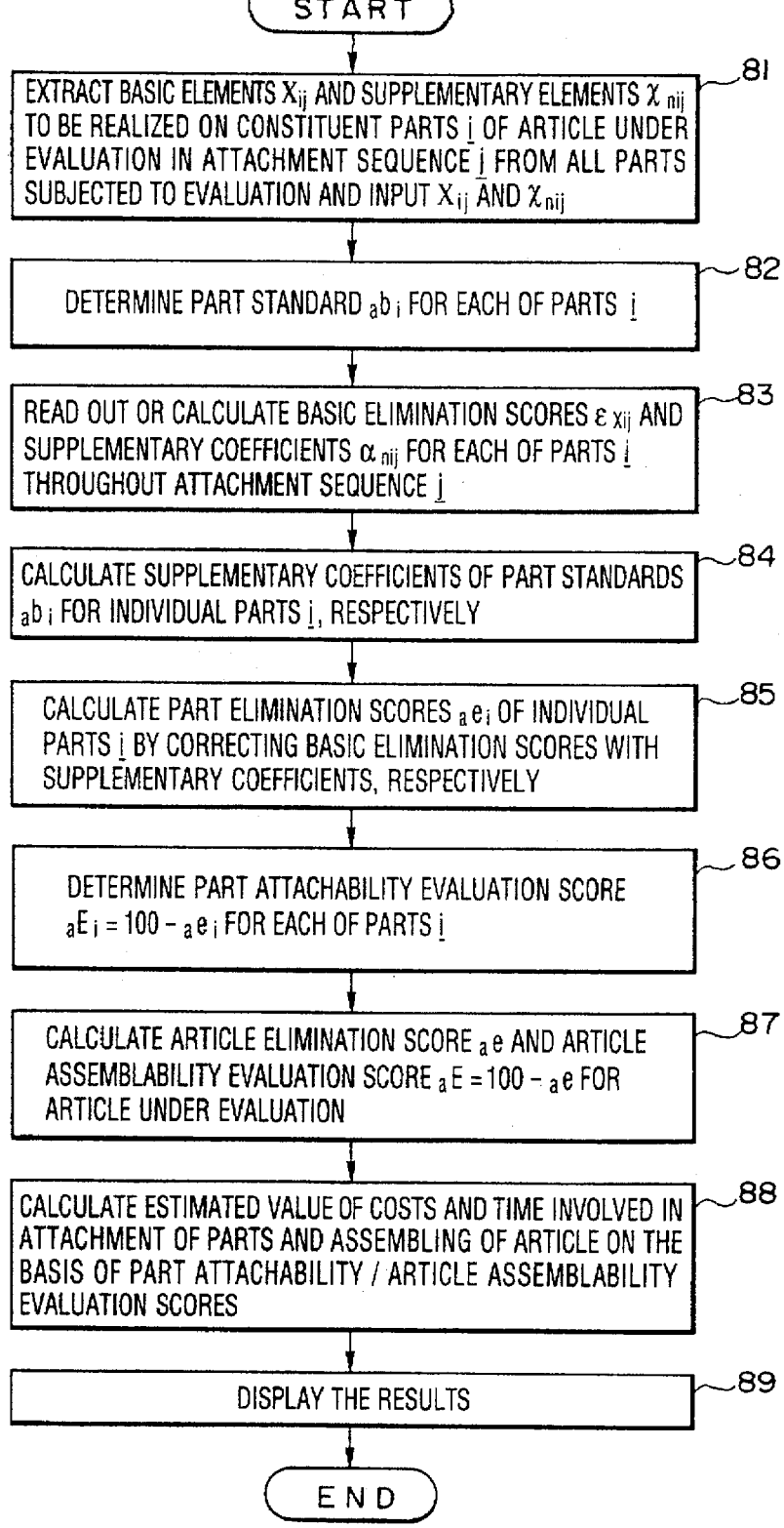

FIG.13

Buttons (100–109):
- 100: SELECT WORK TYPE
- 101: SELECT BASIC ELEMENT
- 102: SELECT SUPPLEMENTARY ELEMENT
- 103: COST / TIME
- 104: REFER TO REAL VALUE DATA
- 105: ENTER REAL VALUE DATA
- 106: DELETE REAL VALUE DATA
- 107: (arrow controls)
- 108: PRINT
- 109: END

REAL COST OF BASIC ELEMENT "ATTACHMENT BY HORIZONTAL MOVEMENT" (→)

| No. | DATA COLLECTING SECTION | DATE OF REGISTRATION | ATTACHMENT COST | NUMBER OF COLLECTED SAMPLES | REMARKS (MEMORANDUM OF WORKING ENVIRONMENT CONDITIONS) |
|---|---|---|---|---|---|
| 18. | MANUFACTURING SECTION B | 1990. 3. 2 | 1.90 | 20 | ------ |
| 19. | MANUFACTURING SECTION A | 1990. 6.10 | 1.86 | 30 | ------ |
| 20. | MANUFACTURING SECTION C | 1990.12. 9 | 1.88 | 110 | ------ |
| 21. | MANUFACTURING SECTION B | 1991. 9.24 | 1.91 | 26 | ------ |
| 22. | MANUFACTURING SECTION A | 1992. 1.16 | 1.87 | 18 | ------ |

FIG.14

REAL COST FOR BASIC ELEMENT "ATTACHMENT BY HORIZONTAL MOVEMENT" (→) AND SUPPLEMENTARY ELEMENT "MAXIMUM SIZE" OF CLASS "ℓ"

| No. | DATA COLLECTING SECTION | DATE OF REGISTRATION | MAXIMUM SIZE | ATTACHMENT COST | NUMBER OF COLLECTED SAMPLES | REMARKS (MEMORANDUM OF WORKING ENVIRONMENT CONDITION) |
|---|---|---|---|---|---|---|
| 9. | X | 1989.7.6 | $\ell_{100}$ | 2.29 | 15 | ------- |
| 10. | Z | 1990.1.18 | $\ell_{101}$ | 2.24 | 50 | ------- |
| 11. | Y | 1990.9.2 | $\ell_{102}$ | 2.26 | 108 | ------- |
| 12. | Z | 1991.8.9 | $\ell_{103}$ | 2.30 | 30 | ------- |
| 13. | X | 1992.4.20 | $\ell_{104}$ | 2.25 | 60 | ------- |

- 100 SELECT WORK TYPE
- 101 SELECT BASIC ELEMENT
- 102 SELECT SUPPLEMENTARY ELEMENT
- 103 COST / TIME
- 104 REFER TO REAL VALUE DATA
- 105 ENTER REAL VALUE DATA
- 106 DELETE REAL VALUE DATA
- 107
- 108
- 109

PRINT   END

FIG.15

| NAME OF PRODUCT : UNIT A | | | | | |
|---|---|---|---|---|---|
| PRODUCTION RATE | 350 / month | | | | |
| SHOP RATE | 50yens / min. | | | | |
| No | PART NAME | BASIC ELEMENT | SUPPLEMENTARY ELEMENT | PART ASSEMBLABILITY EVALUATION SCORE | ESTIMATED PART ATTACHING TIME | ESTIMATED PART ATTACHING COST |
| 1 | BASE | → | L=300 | 100 points | 0.020 min. | 1.0 yens |
| 2 | SHAFT | → → | L=150 | 76 points | 0.036 min. | 1.8 yens |
| 3 | LEAD WIRE | → S | | 55 points | 0.050 min. | 2.5 yens |

| PRODUCT ASSEMBLABILITY EVALUATION SCORE | 54 points |
|---|---|
| NUMBER OF PARTS | 80 |
| ESTIMATED ARTICLE ASSEMBLING TIME | 2.6 min. |
| ESTIMATED ARTICLE ASSEMBLING COST | 130 yens |

| SIMILAR EXISTING PRODUCT : UNIT B | |
|---|---|
| ASSEMBLABILITY SCORE POINT | 40 points |
| NUMBER OF PARTS OF SIMILAR EXISTING PRODUCT | 110 |
| ACTUAL ASSEMBLING TIME OF SIMILAR EXISTING PRODUCT | 3.5 min. |
| ACTUAL ASSEMBLING COST OF SIMILAR EXISTING PRODUCT | 175 yens |

FIG.17

(▽ : SURFACES MACHINED)

| ITEM | EVALUATION INDEX | PART PROCESSABILITY EVALUATION SCORE | ESTIMATED PART PROCESS COST INDEX |
|---|---|---|---|
| BEFORE IMPROVEMENT | 200mm (SUS 6 SURFACES) | 80 points | 100 |
| AFTER IMPROVEMENT | 200mm (SUS 2 SURFACES) | 90 points | 30 |

FIG.19

| PART NO. | PART NAME | NUMBER | PROCESS-ABILITY EVALUATION SCORE | ESTIMATED PROCESSING COST (¥) | ASSEM-BLABILITY EVALUATION SCORE | ESTIMATED ASSEMBLING COST (¥) | MANUFAC-TURABILITY EVALUATION SCORE | ESTIMATED MANUFAC-TURING COST (¥) |
|---|---|---|---|---|---|---|---|---|
| 1 | CHASI | 1 | 20 | 200 | 100 | 20 | 40 | 220 |
| 2 | GEAR | 1 | 40 | 120 | 80 | 30 | 55 | 150 |
| 3 | MOTOR | 1 | — | 0 | 70 | 40 | 70 | 40 |
| 4 | SCREW | 2 | — | 0 | 60 | 45 | 60 | 45 |
| ... | ... | ... | ... | ... | ... | ... | ... | ... |
| TOTAL | | 20 | 45 | 600 | 75 | 200 | 55 | 800 |

FIG. 20

|  | BEFORE IMPROVEMENT | STRUCTURE MODEL A | STRUCTURE MODEL B |
|---|---|---|---|
| PROCESSABILITY EVALUATION SCORE (mE OR mEi) | 50 | 40 | 70 |
| ASSEMBLABILITY EVALUATION SCORE (aE OR aEi) | 50 | 70 | 40 |

FIG. 21

|  | BEFORE IMPROVEMENT | STRUCTURE MODEL A | STRUCTURE MODEL B |
|---|---|---|---|
| PROCESSABILITY EVALUATION SCORE (mE OR mEi) | 50 | 40 | 70 |
| ASSEMBLABILITY EVALUATION SCORE (aE OR aEi) | 50 | 70 | 40 |
| PROCESSABILITY/ASSEMBLABILITY SYNTHETIC EVALUATION SCORE (MANUFACTURABILITY EVALUATION SCORE TE OR TEi) | 65 | 70 | 67 |

FIG. 22A
(1) WORK TYPE IDENTIFICATION RECORD

| 201 | 202 | 203 | |
|---|---|---|---|
| ATTACHABILITY EVALUATION-DESTINED BASIC ELEMENT | PROCESSABILITY EVALUATION-DESTINED BASIC ELEMENT | MANUFACTURABILITY EVALUATION-DESTINED BASIC ELEMENT | ----- |

FIG. 22B
(2) BASIC ELEMENT RECORD

| 204 | 205 | 206 | 207 | 208 | 209 |
|---|---|---|---|---|---|
| DEFINITION DATA | POINTER TO OTHER SIMILAR BASIC ELEMENT RECORD | POINTER TO SUPPLEMENTARY ELEMENT RECORD | BASIC ELIMINATION SCORE $\varepsilon_x$ | COSTS $C_x$ | TIME $T_x$ |

FIG. 22C
(3) SUPPLEMENTARY ELEMENT RECORD

| 210 | 211 | 212 | 213 | 214 | 215 |
|---|---|---|---|---|---|
| DEFINITION DATA | POINTER TO OTHER SIMILAR SUPPLEMENTARY ELEMENT RECORD | POINTER TO REAL SAMPLE DATA RECORD | SUPPLEMENTARY COEFFICIENT $\alpha$ | COSTS $C_{xqn}$ | TIME $T_{xqn}$ |

FIG. 22D
(4) REAL SAMPLE DATA RECORD

| 216 | 217 | 218 | 219 | 220 | 221 | 222 | 223 |
|---|---|---|---|---|---|---|---|
| POINTER TO OTHER SIMILAR REAL SAMPLE DATA RECORD | COLLECTING SECTION ID CODE | DATE OF REGISTER | REAL OF SUPPLEMENTARY ELEMENTS | COST | TIME | NUMBER OF SAMPLES | REMARKS |

FIG.25

EXAMPLES OF RULES FOR REDUCTION OF
PART ATTACHING SEQUENCESS (1) ATTACHMENT SEQUENCE SUCH AS ATTACHMENT OF CLAMPING PART IN PRECEDENCE TO CLAMPED PARTS EXCLUDED AS IRRATIONAL (2) WHEN A PART SUCH AS CHASSIS TO BE ATTACHED FIRST IS PRESCRIBED, PART TO BE ATTACHED IN CONTACT WITH CHASSIS IS MOUNTED IN PROCEDENCE TO PART TO BE ATTACHED WITHOUT CONTACT WITH CHASSIS (3)

FIG.26

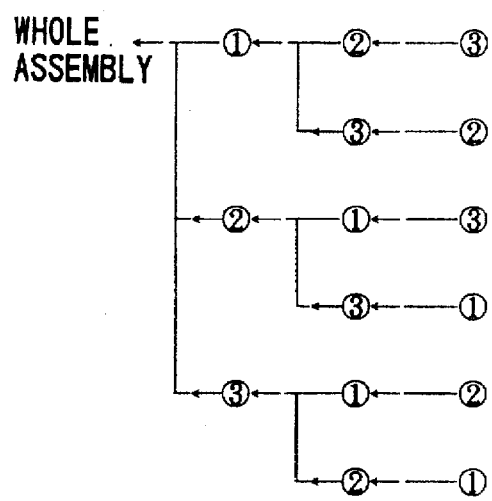
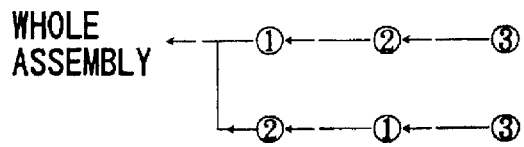

NUMBER OF PARTS: n=3
⇒NUMBER OF ATTACHING
SEQUENCES=3!=3·2·1=6

NUMBER OF REASONABLE
ATTACHING SEQUENCE
NUMBER = 2

(a) ALL PART ATTACHING SEQUENCES (b) REASONABLE PART ATTACHING SEQUENCES

| PART NUMBER | NAME OF PART | FUNCTION OF PART | PART (1) BROUGHT INTO CONTACT | CONTACT STATE | PART (2) BROUGHT INTO CONTACT | CONTACT STATE | SHAPE |
|---|---|---|---|---|---|---|---|
| ① | BASE | BASE PART | ② | SURFACE CONTACT AT SURFACE a | ③ | SCREWWISE INSERTION IN FEMALE SCREW | --- |
| ② | BLOCK | PART TO BE CLAMPED | ① | SURFACE CONTACT AT SURFACE c | ③ | CLAMPING BY SCREW | --- |
| ③ | EYE-BOLT | SCREWS | ① | SCREWWISE INSERTION OF MALE SCREW | ② | CLAMPING SCREW | --- |

FIG.30

| STEP EXAMPLES | ARTICLE STRUCTURE AND ASSEMBLY OPERATIONS | | Ei: PART ASSEMBLABILITY EVALUATION SCORE | E: ASSEMBLABILITY EVALUATION SCORE | K: ASSEMBLY COST RATIO | PART TO BE IMPROVED |
|---|---|---|---|---|---|---|
| STRUCTURE 1 BEFORE IMPROVEMENT | 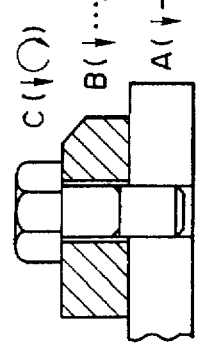 C(↓○) B(↓···) A(↓—) | 1. SET CHASSIS A. | 100 | 73 | 1 | B |
| | | 2. BRING DOWN BLOCK B AND HOLD IT TO MAINTAIN ITS ORIENTATION. | 50 | | | |
| | | 3. FASTEN SCREW C. | 65 | | | |
| STRUCTURE 2 | 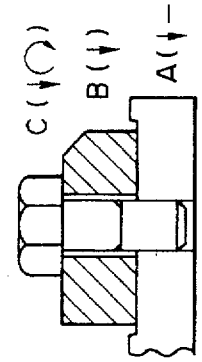 C(↓○) B(↓) A(↓—) | 1. SET CHASSIS A. | 100 | 88 | APPROX. 0.8 | C |
| | | 2. BRING DOWN BLOCK B. (ORIENTATION IS MAINTAINED BY SPOT-FACING.) | 100 | | | |
| | | 3. FASTEN SCREW C. | 65 | | | |
| STRUCTURE 3 | 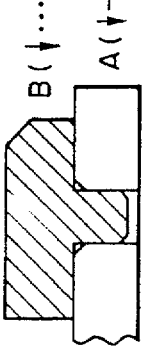 B(↓···) A(↓—) | 1. SET CHASSIS A. | 100 | 89 | APPROX. 0.5 | B |
| | | 2. BRING DOWN AND PRESSFIT BLOCK B. | 80 | | | |

AUTOMATIC MANUFACTURABILITY EVALUATION METHOD AND SYSTEM

CROSS-REFERENCE TO RELATED APPLICATIONS

The present application is a continuation-in-part application of U.S. patent application Ser. No. 654,236 filed on Feb. 12, 1991, abandoned, under the title "METHOD AND APPARATUS FOR EVALUATING OPERABILITY OF ARTICLE" and assigned to the same assignee as the present invention, U.S. patent application Ser. No. 726,997 filed on Jul. 8, 1991, abandoned, which is a continuation-in-part application of the above-mentioned U.S. patent application Ser. No. 654,236 and entitled "METHOD OF EVALUATING OPERABILITY OF ARTICLE AND APPARATUS FOR CARRYING OUT THE SAME", and U.S. patent application Ser. No. 861,302 filed on Mar. 31, 1992, abandoned, under the title "AUTOMATIC MANUFACTURABILITY EVALUATION METHOD AND SYSTEM" which is a continuation-in-part application of U.S. patent application Ser. No. 726,997 also filed as a continuation-in-part application of the above-mentioned U.S. patent application Ser. No. 654,236. The disclosure of the applications mentioned above are incorporated herein by reference.

BACKGROUND OF THE INVENTION

The present invention is directed to improvement of manufacturability of an article or product and/or reduction of manufacturing cost thereof. More specifically, the present invention is concerned with a method of quantitatively evaluating whether or not a designed structure of an article or product is easy to manufacture on the basis of relevant design information prepared or generated by using a computer-aided design system (hereinafter also referred to as the CAD processor in abbreviation), to thereby determine at an earlier stage of a design process a best or optimal design plan or plan and hence a best or optimal manufacturing or fabricating method from a plurality of design plans or plans inclusive of alternative proposals. The present invention is also concerned with a system for carrying out the method mentioned above.

Heretofore, there have been proposed a variety of evaluation methods which allows a design engineer to evaluate in a stage of a design procedure whether or not a product being designed has a structure easy to manufacture. According to a first method referred to as the design review method and adopted widely, the manufacturability (i.e., ease of manufacture) of an article or product as designed is determined by those skilled in the design, production, inspection and other techniques on the basis of their empirical knowledges or experiences, wherein those portions to be improved, if any, are pointed out by them. According to a second evaluation method also adopted generally, a process plan is created on the basis of a design drawing, and the costs involved in processability parts and/or assembling an article as designed as well as the time required therefor is estimated, whereon the expert engineer skilled in the technique for manufacturing the article or product of concern favorableness or satisfactoriness of the designed structure on the basis of the estimated values and his or her empirical knowledges. As third and fourth evaluation methods known heretofore, there can be mentioned those disclosed in a an article entitled "KUMITATEYASUI SEKKEI (Design Easy To Implement)" and contained in "NIKKEI MECHANICAL" published Mar. 21, 1988, pp. 37–48.

According to the third method mentioned above, a part attaching process is analytically divided into several process elements, which are then imparted with respective evaluation scores determined in dependence on the degrees of easiness or difficulty in carrying out the process elements, wherein the processes required for attaching a part are represented by the aforementioned process elements, and then assemblability (degree of susceptibility to assembling) of the article or product of concern as a whole is evaluated on the basis of the calculated totality of the evaluation scores imparted to the individual process elements while extracting those process elements which make the part attachments difficult.

In this conjunction, it should however be mentioned that there is contained in the article mentioned above neither teachings nor suggestions as to the method for assigning the evaluation scores, the method for totalization of the evaluation scores and others. Apparently, the design engineer determines an overall or synthetic optimality for a plural kinds or sorts of workabilities such as processability (degree of susceptibility to processing), assemblability (degree of susceptibility to assembling) and the like by relying on some means. However, in the case of the evaluation method mentioned above, the favorableness or satisfactoriness is decided rather intuitively without presenting definitely the ground for the decision.

According to the fourth method mentioned above, items to be checked are classified to alignability, positionability, chuckability, attachability and other features of parts are allocated with scores determined intuitively or empirically which represent degrees of easiness or difficulty of aligning, positioning, chucking, attaching and so forth of the parts. Upon evaluation of the assemblability of a given article as designed, the design engineer determines the presence or absence of the items for checking that are applicable to the article of concern and inputs them to the system, whereon the assemblability of the article as a whole is evaluated on the basis of a sum of the above-mentioned scores assigned to the selected items while those parts providing difficulty in assembling thereof are extracted. In conjunction with calculation for the totalization described above, it is reported in the article cited previously that for each of the individual parts, the scores mentioned above are subtracted or eliminated from the full mark of "100 points", whereon the total score for all the relevant check items is determined, and improvement of the design is performed until the mean value of the total scores of the individual parts attains at least seventy points.

At this juncture, it is also noted that JP-A-61-59900 discloses a method for design improvement which is applied to assembling of a printed substrate package and according to which evaluation scores are determined and displayed by resorting to a procedure similar to the fourth method described above.

The first mentioned prior art evaluation method is of a qualitative nature rather than quantitative and is disadvantageous in that not a little difficulty is encountered in expressing objectively and quantitatively to what extent the structure of an article or product under evaluation is favorable or unfavorable (satisfactory or unsatisfactory) for manufacturing or how effective the improvement as attempted will be. Besides, this method suffers from a problem that it can be carried out only by those having sufficient skilfullness in the design and manufacture engineering. According to the second mentioned prior art evaluation method, the assembling cost can certainly be estimated for an article or product as a whole or for every individual part or for some of the parts constituting the article. However, it is difficult to decide merely on the basis of only the assembling costs whether the designed structure is well qualified or whether any further improvement is necessary. Moreover, this known method has a drawback that the evaluation requires not a few experiences and knowledges as well as lots of time for the calculations involved therein, which makes the evaluation very difficult. Besides, unless the design of the article of concern has been completed, evaluation itself is rendered difficult. Consequently, improvement or modification of the design as found necessary can not be done until the design has been completed, which in turn means that an intolerable lot of time and expenditure will be taken for any further improvement of the design once completed. Under the circumstances, many articles designed rather unsatisfactorily or unfavorably have to be transferred to a production line without undergoing the further improvement, thus giving rise to a problem that the attempt for enhancing the productivity and reducing the cost often encounters an obstacle.

In brief, the first and second methods described above suffer from the shortcomings mentioned below.

(1) Evaluation is not quantitative but qualitative by nature, making impossible the quantitative evaluation.

(2) Evaluation can be made only by those having an abundance of experience or some knowledge of evaluation procedure. Further, the synthetic satisfactoriness of a decision for a plurality of different types of works or processes can not be made while presenting explicitly the ground therefor.

(3) With the evaluation based only on such factors as the attachment/assembling cost and/or the processing cost, it is difficult to decide whether the design is satisfactory or not.

(4) Enormous labor or time is required for the evaluation.

(5) Evaluation can be made only after the design has been completed or at some time point close to the completion of the design, which makes it difficult to improve the design after the evaluation.

(6) It is difficult to improve the article or parts because of difficulty in deciding the quality of design on the part-by-part basis.

With the third and fourth prior art methods described hereinbefore, it is contemplated to tackle or solve the problems enumerated above. The third prior art evaluation method certainly permits a time-sparing evaluation without need for rich experience. However, there arise such problems that relations between the evaluation indexes and the cost and time involved in the process are indefinite and that the cost and the result of evaluation is difficult to verify because of the lacking of a definite and concrete presentation of the engineering standards which are relied on in determining the relation between the evaluation index and the expenditure. Accordingly, it is ambiguous "what meaning a high evaluation score has", presenting thus a problem that it is impossible to decide with high accuracy whether the assemblability evaluation is of high qualification or reliability. Besides, since the evaluation is made on a process basis, it is difficult to specify those parts of an article which are poor in attachability.

The fourth prior art method described hereinbefore is also disadvantageous in that it is not clear whether a high or low evaluation score can really lead to low or high cost because of a lacking of a presentation of the definite engineering standards for determining the relations between the evaluation indexes and the assembling costs. Besides, it is considered that a large number of items to be checked for the evaluation makes it difficult to execute the evaluation procedure.

The inventors of the present application have developed an assemblability evaluation method for evaluating quantitatively the degree of easiness of assembling, i.e., assemblability, and a processability evaluation method for evaluating the degree of ease of processing, i.e., processability, which are distinguished from the third and fourth methods described hereinbefore and already proposed as a manufacturability evaluation method for evaluating the degree of ease of manufacturing an object as designed on the basis of the results of the assemblability evaluation method and the processability evaluation method mentioned above. Reference may be made to "KIKAI SEKKEI (MACHINE DESIGNING)" published by Nikkan Kogyou Shinbun Company of Japan, Vol. 33, No. 7 (June, 1989), pp. 39–47.

More specifically, the proposal made by the inventors and disclosed in the above-mentioned literature is directed to a method of aiding a design engineer in making the decision quantitatively whether or not an article is easy to manufacture on the basis of a design plan of that article at an earlier stage of design process and a method of aiding the design engineer in proceeding with improvement of the design on the basis of the result of the evaluations made on the design plan presented for the evaluation.

According to the method now under consideration, works to be done in various manufacturing steps on individual parts constituting an article of concern are classified to basic elements and supplementary elements for each kind of works (e.g. for each of assembling work and processing work such as machining or the like), wherein information or data indicating works to be performed on the individual parts constituting the article under evaluation in terms of the relevant basic elements and the supplementary elements, respectively, is inputted to a system together with a command for making evaluation concerning the degree of easiness or difficulty of works involved in manufacturing the article of concern.

For carrying out the method under consideration, real values of the costs and the time involved in the various works actually done by combinations of given basic elements and supplementary elements, respectively, are inputted to the system for arithmetically determining in precedence the indexes (referred to as basic elimination scores and supplementary coefficients) indicating the workability or the degrees of ease of works to be performed on the individual parts on the basis of the basic elements and the supplementary elements, the results of which are stored in a database.

On the other hand, the system for carrying out the instant method is so arranged as to accept the evaluation request for groups of the basic elements, the supplementary elements and others for the article under evaluation as inputted by the analyzer, to thereby calculate the evaluation score indicating the workability of the article under evaluation (i.e., degree of easiness or difficulty of works involved in assembling, processing and/or manufacturing the article) by reference to the data stored in the database, the results of the calculation being outputted.

FIG. 1 of the accompanying drawings shows schematically an arrangement of the system mentioned above. A design engineer or analyzer 10 reads information required for evaluation from a drawing 11 or a sample 12 and inputs the information into a manufacturability evaluation system 14 via a keyboard 13, whereon the system 14 performs the evaluation on the basis of the information. The result of the evaluation is outputted through a printer 15. The analyzer 10 decides satisfactoriness of the manufacturing method of concern on the basis of the data as printed out. Design improvement, if necessary, is performed (step 16) and the information is fed back to a CAD processor 21.

Problems of the third and fourth methods as well as the method developed by the inventors of the present application (hereinafter referred to as the fifth method) are summarized below.

(1) In these methods, it is a prerequisite that the individual items for evaluation and the indexes indicating the degrees of ease of the works for the basic elements, the supplementary elements and the process elements representing the elements or components of a work have to be created in precedence and registered in the database. However, the method of creating the indexes as well as the relations between the indexes and the costs which can be known from the creating method are regarded as the know-how and not published.

(2) The analyzer has to specify a method of manufacturing an article which constitutes the object for the design and then selects or extracts the items for evaluation, the basic elements, the supplementary elements and the process elements for inputting them to the system together with a command for execution of the evaluation.

(3) It is a precondition that after the system has determined arithmetically the evaluation score representing the index indicating the manufacturability (degree of easiness or difficulty of manufacture) of an article as designed, the analyzer has to make a decision on the basis of the results outputted from the system as to satisfactoriness of the manufacturing method as well as the necessity or unnecessity of design improvement. Consequently, the step of decision made by the human being necessarily intervenes in feeding back the results of the evaluation to the CAD processor.

(4) None of the literatures introducing the prior art methods mentioned above discloses practically workable modes which enable these methods to be actually carried out.

(5) In the case of the fifth method, difficulty will be encountered in making a decision on the basis of two evaluation indexes for the processability and the assemblability as to whether the design of concern is to be satisfactory or not, i.e, whether it is optimal for the manufacturing of the article of concern. Let's assume, by way of example, that there are presented to a design engineer a structuring model A improved in respect to the assemblability at the expense of processability because of primary reliance on the assemblability evaluation method and a structuring model B improved in the processability at the expense of the assemblability by relying primarily on the processability evaluation method, as is illustrated in FIG. 9 of the accompanying drawings. In such situation, the design engineer will not be able to make decision straightforwardly as to which of the model A or B should be adopted.

SUMMARY OF THE INVENTION

With the present invention, it is contemplated as a first object thereof to realize a function for enabling the evaluation concerning the workability (i.e., degree of ease of the work) of an article or a part for every type of works to be performed thereon and then evaluating synthetically the workability for plural types of works by processing the results of the workability evaluation.

To this end, a function formula is established such that the evaluation score is decreased or increased when the sum of the working costs and time involved in performing works to be performed on an article or part of concern which is to undergo plural kinds of works increases relative to a sum of corresponding values of an article standard or part standard, and then the evaluation score determined by the above function is defined as an index indicating a quality or degree of a synthesized workability for the plural kinds of works to be performed on the article or part, i.e., as a synthetic workability evaluation score indicating synthetically the degree of workability of the article or part under evaluation for the plural kinds of works to be performed thereon. Similarly, plural kinds of works (e.g. processing work and assembling work) may be considered as a work of conceptually more general kind (e.g. manufacturing work in the broader sense). Thus, a synthetic evaluation score indicating synthetically the degree of ease of the more general kind of work (i.e., manufacturing work encompassing both the processing work and the assembling work in the case assumed above) may be determined by defining the basic elements, standard elements, supplementary elements, article standards, part standards and the like for each of the conceptually more general kinds of works through the procedure similar to that for determining the synthetic evaluation score for the individual works as mentioned above.

A second object of the present invention is to implement a function for presenting in a systematized form a method of generating indexes which indicate degrees of ease of works for each of basic elements which are derived by classifying attaching or assembling operations, processing operations and/or the like into respective basic components or elements for evaluation and supplementary elements exerting influence to the works involved in effectuating the basic elements and to realize a function for updating the values of the indexes so that they can approximate as closely as possible the real index values by inputting the real values such as real working cost and real working time.

A third object of the present invention is to realize functions for estimating a method of manufacturing a product or article as designed on the basis of design drawing data generated by a CAD processor, estimated works or operations which the product or article of concern is to undergo during the process of manufacturing thereof to thereby determine the elements for evaluation (i.e., basic elements and supplementary elements) and input them to a manufacturability evaluation system.

A fourth object of the present invention is to realize a function for creating a plurality of design plans for one and the same object with the aid of a CAD processor, evaluating each of the design plans in respect to the manufacturability, the comparing of the results of the evaluation to thereby allow information concerning the determination of optimal design or a decision of improvement of the design to be fed back to the CAD processor without resorting to intervention of a human being.

With a view to achieving the objects mentioned above, there is provided an automatic manufacturability evaluation system connected to a CAD processor, which system is implemented in an arrangement illustrated in FIG. 2. In this conjunction, there is conceivable an integral structure in which the automatic manufacturability evaluation system is incorporated in a CAD processor system. Furthermore, such an arrangement is equally conceivable in which the automatic manufacturability evaluating system is divided into a single server machine section and a plurality of client machine sections which are interconnected via a communication network, as shown in FIG. 3. In particular, the client machines may be installed in a plurality of design sections and additionally in manufacturing sections for acquiring or collecting real values of manufacturing costs and working time for thereby enabling the real values to be inputted as sample values, as can be seen from FIG. 3 among others.

By referring to the arrangement shown in FIG. 3, by way of example, a system configuration will be described below.

The invention is directed to a designed object workability evaluating system for evaluating quantitatively at a stage of designing an article whether a structure of the article as designed can be realized with work easy to do in a manufacturing stage, for thereby selectively determining a best structure from a plurality of design plans through comparative evaluation thereof.

The system is composed of two components mentioned below:

A client machine section which includes a guide information generating unit for generating information for guiding operations of a user, an input device for allowing the user to input commands and data, and a display control unit for displaying on a display unit the guide information and results of evaluations performed by the system.

A server machine section which includes a registering unit for registering in a storage evaluation-destined elements defined by the user, a storage for storing information to be used in evaluation processing, an index calculating module for calculating indexes indicating degrees of difficulty/easiness of works involved in realizing the evaluation-destined elements already registered in the storage, an evaluation-destined element estimating module for estimating the evaluation-destined elements to be performed on parts constituting an article given by a design plan subjected to evaluation, a part workability evaluation module for evaluating easiness of works to be performed on the parts, an article workability evaluation module for evaluating easiness of works involved in realizing the article, and a best design plan selection/determination module for selectively determining a best structure from a plurality of design plans through comparative evaluation thereof.

The system may be composed of one client machine section and one server machine section or alternatively a plurality of client machine sections and one server machine section interconnected by a communication network.

In the designed object workability evaluating system described above, the guide information generating unit may be so arranged as to generate at least one of three pieces of guide information mentioned below:

(1) First guide information for allowing the user to make definition of new evaluation-destined elements or to perform operation for correcting the registered evaluation-destined element(s) on the basis of the registered evaluation-destined elements displayed on the display unit.

(2) Second guide information for displaying on the display unit standard conditions of other evaluation-destined elements which exert influence to the working cost involved in the work to be performed on one registered evaluation-destined element which the user or working time required for the work to be performed on the one registered evaluation-destined element in order to guide the user in inputting a working cost or a working time required for the work for performing the one evaluation-destined element on a standard article.

(3) Third guide information for indicating to the user a procedure for inputting evaluation-destined elements to be realized at the manufacturing stage on the individual parts constituting the article given by the design plan subjected to evaluation and commanding the evaluation or alternatively a procedure for inputting design data of the object for evaluation from a computer-aided design system and commanding the evaluation.

Further, in the designed object workability evaluating system, the input unit may be so implemented as to receive data and commands inputted by the user or design data supplied from a computer-aided design system.

Furthermore, in the designed object workability evaluating system, the storage unit may be so arranged as to store therein the evaluation-destined elements, the indexes indicating the degrees of difficulty/easiness of the works, real costs and real time involved in the works performed on the evaluation-destined elements while establishing correspondence relations among them.

Additionally, in the designed object workability evaluating system, the registering unit may be so constituted as to register the evaluation-destined elements defined newly by the user in the storage or alternatively correcting the registered evaluation-destined element of which correction is commanded by the user and again registering the corrected evaluation-destined element in the storage or alternatively registering real costs and real time involved in the works performed on the evaluation-destined elements, respectively.

Moreover, in the designed object workability evaluating system, the index calculating module may be so implemented as to calculate the indexes indicating the degrees of difficulty/easiness of the works involved in realizing the registered evaluation-destined elements on a standard article on the basis of either one of data concerning the real costs or the real time involved in the works as inputted by the user.

In addition, in the designed object workability evaluating system, the evaluation-destined element estimating module may be so implemented as to estimate the evaluation-destined elements to be realized in the manufacturing stage on the individual parts constituting the article given by the design plan subjected to evaluation on a part-by-part basis on the basis of the commands inputted by the user and the design data available from the computer-aided design system.

Further, in the designed object workability evaluating system, the part workability evaluation module may be so implemented as to read out the indexes indicating the degrees of difficulty/easiness of works registered in the storage in correspondence to the registered evaluation-destined elements on the basis of the evaluation-destined elements to be performed on the individual parts as inputted by the user or alternatively generated by the evaluation-destined element estimating module, to thereby calculate the part workability evaluation scores indicating the degrees of easiness of the works to be performed on the individual parts constituting the article given by the design plan.

Furthermore, in the designed object workability evaluating system, the article workability evaluation module may be so implemented as to read out the indexes indicating the degrees of difficulty/easiness of works registered in the storage in correspondence to the registered evaluation-destined elements on the basis of the evaluation-destined elements to be performed on the individual parts as inputted by the user or alternatively generated by the evaluation-destined element estimating module, to thereby calculate the article workability evaluation scores indicating the degrees of easiness of works to be performed on the article given by the design plan.

Moreover, in the designed object workability evaluating system, the best design plan selection/determination module may be so implemented as to compare the article workability evaluation scores of the plurality of design plans to thereby selectively determine a structure of the design plan having gained a highest evaluation score.

Additionally, in the designed object workability evaluating system, the display control module may be so implemented as to output the guide information generated by the guide information generating unit, the results of the selective determination, the part workability evaluation scores of each of the parts and the article workability evaluation score for the article, which are to be displayed on the display unit.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which:

FIG. 4 is a view showing exemplary basic elements involved in an assembling work together with the contents thereof, symbols and others in the form of a table;

FIG. 5 is a view for illustrating examples of supplementary elements involved in an assembling work together with the contents thereof, symbols and others in the form of a table;

FIG. 6 is a view showing exemplary basic elements involved in a processing work together with the contents thereof, symbols and others in the form of a table;

FIG. 7 is a view for illustrating examples of supplementary elements involved in a processing work together with the contents thereof, symbols and others in the form of a table;

FIG. 8 is a flow chart for illustrating an evaluation process for executing an attachability/assemblability evaluation method;

FIG. 13 is a view showing, by way of example, real value data concerning those basic elements which are registered in a storage unit and others as generated on the display unit to be referenced by user;

FIG. 14 is a view showing, by way of example, real value data concerning those supplementary elements which are registered in the storage unit and others as generated on the display unit to be referenced by user;

FIG. 15 is a view showing, by way of example, results of an attachability/assemblability evaluation as executed;

FIG. 17 is a view showing, by way of example, improvement of design based on a processability evaluation method;

FIG. 19 is a view showing exemplary values of processability evaluation score and estimated processing costs, assemblability evaluation scores and estimated assembling costs, and manufacturability evaluation scores and estimated manufacturing costs as outputted from the system;

FIG. 20 is a view showing, by way of example, results of evaluation of designed structures A and B by a processability evaluation method and an assemblability evaluation method separately from each other;

FIG. 21 is a view showing, by way of example, results of evaluation of designed structures A and B by a synthetic processability/assemblability evaluation method;

FIGS. 22A to 22D are views showing, by way of example, formats of real data records, respectively;

FIG. 25 is a view showing examples of rules as knowledge information for screening assembling sequences;

FIG. 26 is a view showing, by way of example, how to decrease the number of assembling sequences;

FIG. 30 is a view showing, by way of example, result of selective determination of a best design plan from plural ones, as generated on a screen of a display unit.

DESCRIPTION OF THE PREFERRED EMBODIMENTS

Figure 1:
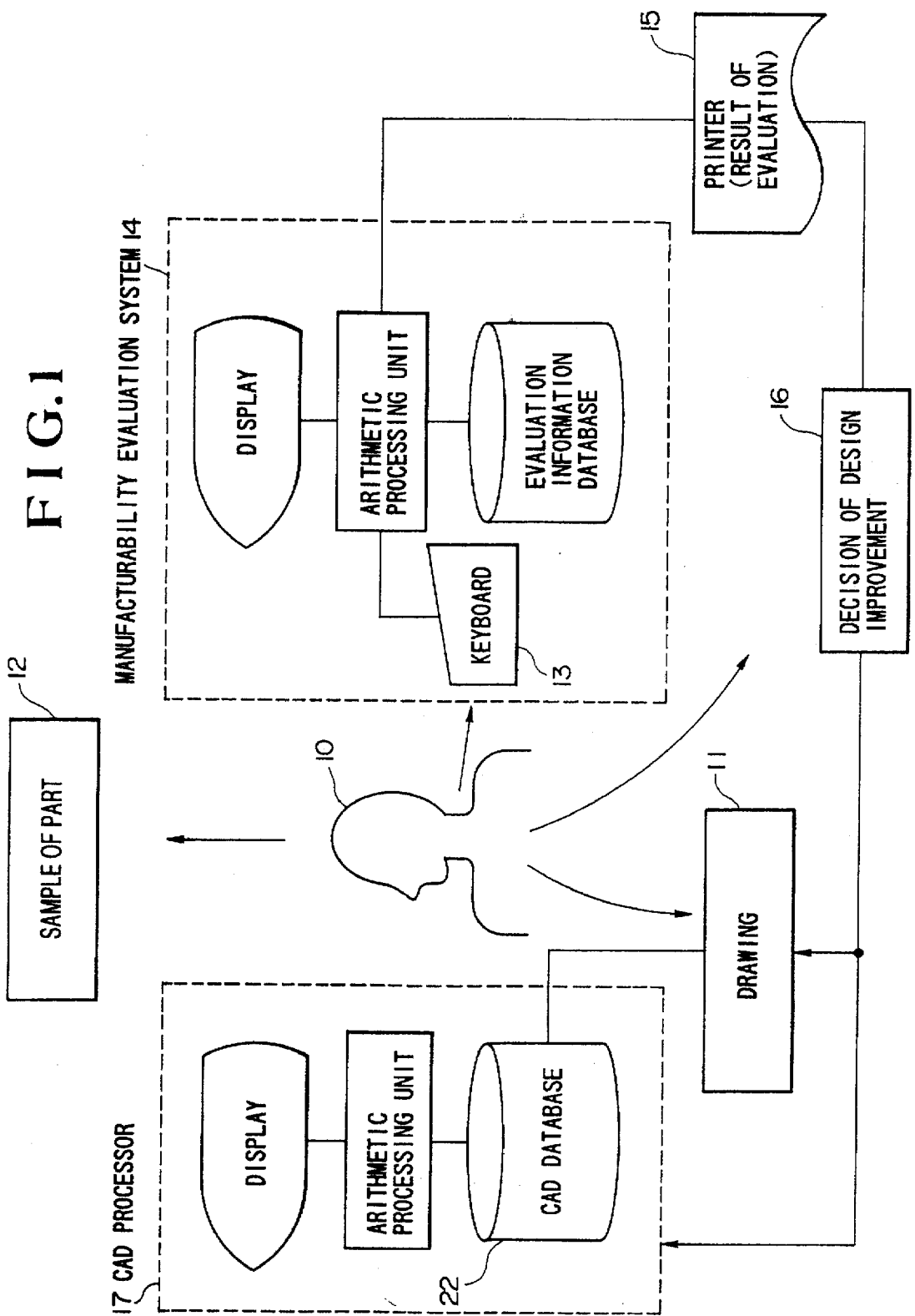
FIG. 1 is a diagram for illustrating flows of processings for design, evaluation of manufacturability and improvement of design according to a conventional method known heretofore.
Figure 2:
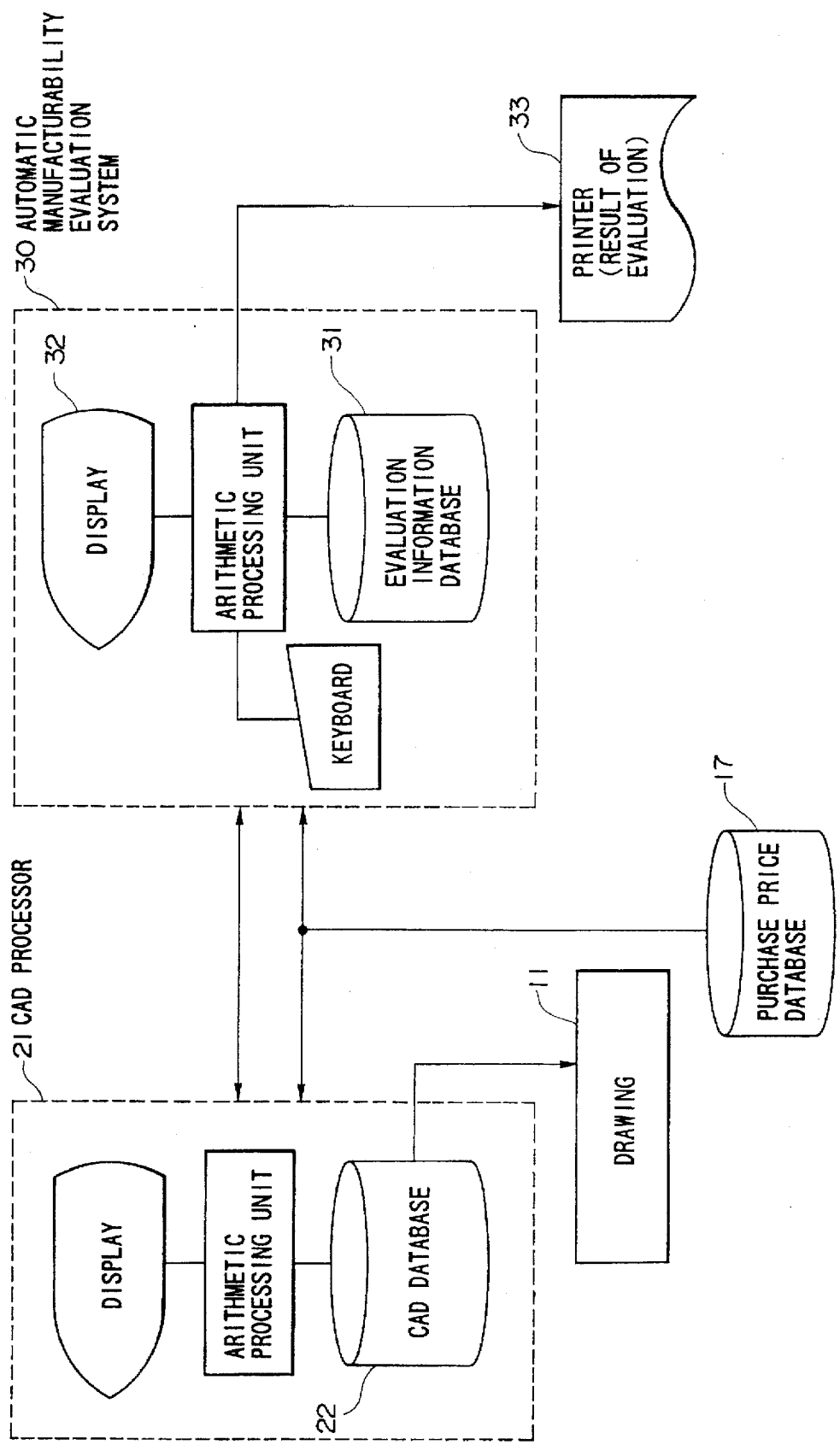
FIG. 2 is a block diagram showing, by way of example, a structure of an automatic manufacturability evaluation system connected to a CAD (computer-aided design) processor.

Now, the present invention will be described in detail in conjunction with what is presently considered as preferred or typical embodiments thereof by reference to the drawings. In the following description, like reference characters designate like or corresponding parts or quantities throughout the several views. Also in the following description, it is to be understood that such terms as "left", "right", "upward", "downward" and the like are words of convenience and are not to be construed as limiting terms.

At first, description will be directed to an assemblability evaluation method.

The basic concept underlying the assemblability evaluation method resides in:

① classifying elementary operations or works involved in attachment of parts upon assembling an article depicted in a design drawing to thereby define the elementary operations or works as the basic elements, respectively;

② defining indexes indicating "degrees of difficulty/ easiness" involved in implementing the individual basic elements, wherein the phrase "degree of difficulty/easiness" means a measure or a rule which allocates a greater score to the basic element whose implementation is difficult while imparting a smaller score to the basic element when implementation thereof is easier);

③ classifying those factors which exert influence to the "degrees of difficulty/easiness" of the works required for implementing the basic elements and defining them as supplementary elements;

④ defining indexes indicating degrees of influence which the individual supplementary elements can exert;

⑤ determining indexes of easiness indicating degrees of easiness of attachment of parts constituting an article or product (also referred to as the part attachability evaluation score) on the basis of the indexes indicating the basic elements and the supplementary elements, respectively, involved in attachments of the parts, wherein the phrase "index of easiness" means the index which assumes a greater score as the attachment of the relevant part is easier);

⑥ determining the index indicating the degree of easiness of the works for assembling the designed article or product (referred to as the article or product assemblability evaluation score) on the basis of the indexes indicating the degree of easiness of the works involved in the attachments of the individual parts for assembling the designed article; and ⑦ estimating the attachment costs or attachment time of the parts and the assembling cost or assembling time of the article or product on the basis of the part attachability evaluation scores and the article assemblability evaluation score.

FIG. 4 is a chart showing a table of examples of the basic elements ($_aX$) which can be employed in carrying out an assemblability evaluation method according to an embodiment of the present invention.

Referring to the figure, a first basic element listed in a first row of the leftmost column has a name or identifier "ATTACHMENT BY DOWNWARD MOVEMENT" and is indicated by a symbol "↓". Thus, this basic element represents a linear downward movement or displacement of a part upon attachment thereof in assembling an article or product.

A second basic element listed in a second row of the first column has a name "ATTACHMENT BY HORIZONTAL MOVEMENT" and is indicated by a symbol "→". This second basic element represents a horizontal movement or displacement of a part upon attachment thereof.

Similarly, a basic element in a fourth row of the first column has a name "ATTACHMENT BY ROTATIONAL MOVEMENT" and means that a rotational movement of a part is involved in attaching the same.

In the light of above comments, contents of other basic elements listed in the table of FIG. 4 will be self-explanatory.

Again referring to FIG. 4, there are shown in a fourth column the basic elimination scores $_a\epsilon_x$ which serve as the indexes indicating the degrees of difficulty/easiness involved in the works or operations for realizing the corresponding basic elements $_aX$, respectively. In conjunction with the basic elimination score, it is to be noted that the basic elimination score of the basic element "ATTACHMENT BY DOWNWARD MOVEMENT" which is the easiest operation or work for attaching the part is assumed to be zero "0" and thus the basic element "ATTACHMENT BY DOWNWARD MOVEMENT" is defined as the standard element and designated by $_aX_0$. On the other hand, the basic elimination scores of the other basic elements $_aX$ assume greater values as greater difficulty is encountered in attaching the corresponding parts.

Now, representing by $_aC_{x0}$ the cost involved in attachment (hereinafter referred to as the attachment cost) for the standard basic element $_aX_0$ while representing the attachment costs $_aC_x$ for the other basic elements designated by $_aX$, then the basic elimination scores $_a\epsilon_x$ of the other basic elements $_aX$ can be determined in accordance with one of the following expressions (1) and (2):

$$_a\epsilon_x = a_1(_aC_x/_aC_{x0}) + b_1 \quad (1)$$

where $a_1$ represents a positive constant and $b_1$ represents a constant, and $$_a\epsilon_x = a_2(_aC_x - _aC_{x0}) + b_2 \quad (2)$$

where $a_2$ represents a positive constant and $b_2$ represents a constant.

Alternatively, by using the time taken for attachment (referred to as the attachment time) $_aT_{x0}$ for the standard basic element $_aX_0$ and the attachment time $_aT_x$ for the other basic elements $_aX$, the basic elimination scores $_a\epsilon_x$ for the other basic elements $_aX$ may be determined in accordance with expressions similar to those (1) and (2) mentioned above.

FIG. 5 shows a table listing examples of the supplementary element represented by $_a\chi$ and employed in the assemblability evaluation method. As the typical examples of the supplementary elements $_a\chi$, there may be mentioned maximum sizes l of parts, masses (weights) m of parts, geometrical accuracy p of parts and others.

For each of these supplementary elements (l, m, p, ...), the status thereof is classified into one or n items (where n represents an integer not smaller than one "1")n, and one of the items is defined as the supplementary standard ($l_0$, $m_0$, $p_0$, ...) for each of the supplementary elements. These items can be designated by extracting from the drawing prepared by the designing, CAD data, a sample article or product or parts and exerts the degrees of difficulty/easiness in attachments of parts and hence degrees of difficulty/easiness in implementing the basic elements.

As can be seen in FIG. 5, as the supplementary index indicating the degree of influence exerted by the item (or items) $_a\chi_n$, of each supplementary element in terms of a numerical value, there is defined and employed a supplementary coefficient $_a\alpha$. In this conjunction, it is assumed that the supplementary coefficients $_a\alpha_{l0}$, $_a\alpha_{m0}$, and $_a\alpha_{p0}$ for the supplementary standards $l_0$, $m_0$ and $p_0$ each defined for each of the supplementary elements l, m and p as mentioned above has a degree of influence which is to serve as the reference and which is represented by a numeral value "1.0" and that the supplementary coefficients $_a\alpha_n$ for the statuses (classes or ranks) of the individual supplementary elements except for the supplementary standard assume numerical values greater than "1.0" with reference to the supplementary coefficient of the supplementary standard, as the influences of the supplementary elements make more difficult the attachment of the corresponding parts. By way of example, in order to derive the relation mentioned above in conjunction with the supplementary element "MAXIMUM SIZE" 1, the attachment cost $_aC_{X,l1}$ involved in attaching one basic element $_aX$ is collected in terms of a real value on the condition that all the other supplementary elements (m, p, . . .) are in the statuses equivalent to the respective supplementary standards. In more concrete terms, referring to FIG. 5, it is shown, by way of example only, that when the maximum size of the part lies within a range of "0" to "$S_1$", i.e., when the maximum size belongs to the class $l_1$ which serves as the supplementary standard, the attachment cost $_aC_{X,l1}$ involved in realizing the basic element "ATTACHMENT BY DOWNWARD MOVEMENT" (↓) is 1.26 yen. Similarly, the attachment cost for the basic element "ATTACHMENT BY HORIZONTAL MOVEMENT" is 1.89 yen.

On the other hand, in the case where the maximum size of a part lies within a range of $S_1$ to $S_2$, i.e., when the maximum size belongs to the class of status $l_2$, the attachment cost $_aC_{X,l2}$ involved in implementing the basic element "ATTACHMENT BY DOWNWARD MOVEMENT" is 1.51 yen, while the attachment cost for the basic element "ATTACHMENT BY HORIZONTAL MOVEMENT" is 2.27 yens, as can be seen in FIG. 5.

In a similar manner, the attachment costs can be collected for the other basic elements.

On the conditions described above, the supplementary coefficient $_a\alpha_{l2}$ of the supplementary element "MAXIMUM SIZE" 1 for the class $l_2$ is defined as a mean value of all the ratios $_aC_{X,l2}/_aC_{Xl0}$ determined for each of the basic elements $_aX$ for which the attachment costs are collected. This relation may be represented by the following expression:

$$_a\alpha_{l2} = (_aC_{X,l2}/_aC_{X,l0})X_{mean} \qquad (3)$$

Needless to say, the status in each class has a range within which the status may vary, which in turn means that the real value of the attachment cost may vary within a certain range. It is however assumed that the real values are collected on the same condition.

Through the procedure described above, the supplementary coefficients of the individual supplementary elements except for the supplementary standard can be determined for the individual classes of the supplementary coefficients, respectively. At this juncture, it should however be noted that although the method of determining the supplementary coefficient described above is directed to the determination of the supplementary coefficient concerning one status in a given one of the classes of a given one of the supplementary elements except for the supplementary standard, it is equally possible to sample a plurality of statuses belonging to the same class and determine the supplementary coefficients for every status, whereon a mean value of the supplementary coefficients thus determined is representatively used as the supplementary coefficient for that class. This method may be applied to determination of the supplementary coefficient for each of the classes of the supplementary element "GEOMETRICAL ACCURACY".

On the other hand, for each of the classes of the supplementary elements "MAXIMUM SIZE" and "MASS", the relation between the supplementary coefficient and the "MAXIMUM SIZE" is determined on the basis of the supplementary coefficients concerning a plurality of statuses, as described above in conjunction with the supplementary coefficient for the class $l_2$, whereon the relation is determined on a class-by-class basis, as follows:

$$_a\alpha_{l2} = a_{10}([\text{MAXIMUM SIZE}] - S_1) + 1.0 \qquad (4)$$

where $a_{10}$ and $S_1$ represent constants, respectively.

Typical examples of the supplementary coefficients determined in accordance with the methods described above are shown in FIG. 5. Besides, numerical values of the attachment costs are shown, only by way of example, in FIG. 5 for each of the basic elements (e.g. $_aX=↓$ and $_aX=→$) on a class-by-class basis.

In the foregoing description, it is assumed that the supplementary coefficients are determined by collecting the attachment costs. It is however conceivable to determine the supplementary coefficients on the basis of the attachment time $_aT_{X,l}$ as collected by resorting to similar methods as well.

Parenthetically, it should be mentioned that the attachment costs $_aC_X$ of the basic elements $_aX$ and the attachment costs $_aC_{X0}$ of the standard element $_aX_0$ are all given by the real values collected when each of the supplementary elements is in the state of the supplementary standard.

In the foregoing, description has been made of the basic elements which are derived by classifying the elements for evaluation of the works involved in attaching parts for assembling a designed article or product as well as the supplementary elements which exert influence to the degrees of difficulty/easiness of the works for realizing the basic elements. In this conjunction, it is to be noted that the supplementary coefficients of the supplementary elements "MAXIMUM SIZE" and "MASS (WEIGHT)" are defined as bearing such functional relationships to "MAXIMUM SIZE" and "MASS (WEIGHT)" as shown in FIG. 5. This in turn means that the degree of influence exerted to the degrees of difficulty/easiness of the attachment/assembling work will vary as the maximum sizes and the masses of the individual parts change. More specifically, it is assumed that an article or product subjected to the evaluation is constituted by a plurality of parts i (i=1 to r, where r represents a positive integer). In this conjunction, it is again assumed that the index indicating the degree of easiness of the work for assembling the aforementioned article or product by performing sequentially the part attachment works by executing at least one basic element $_aX_{ij}$ (j=1 to t, where t represents a positive integer) on each of the pats i is to be determined. In that case, when the supplementary coefficients are to be used in such a manner as elucidated previously, the supplementary coefficients of those parts which are large in respect to the size and the mass (weight) will degrade the index of the degree of easiness of the work when compared with the supplementary coefficients of the parts whose size and mass are relatively small. For this reason, the index indicating the degree of easiness of the work required for attachment of a part of small size and/or mass and the index indicating the degree of easiness of the work for a part having a large size and/or mass can not be used exchangeably or equivalently to each other as the measure for quantitatively deciding whether a design of concern is to be satisfactory or not.

Under the circumstances, it is proposed according to the invention to provide a part standard in order to cope with the problem mentioned above.

To be more concrete, as a part standard $_ab_i$ for a given part i to be attached for assembling an article or product, let's suppose a virtual part having a maximum size represented by $1/_al_b$ (where $_al_b$ is a positive constant) of "MAXIMUM SIZE" of the given part i and a mass represented by $1/_am_b$ (where $_am_b$ is a positive constant) and assume that a work corresponding to the basic element "ATTACHMENT BY DOWNWARD MOVEMENT" is to be performed on the aforementioned part standard $_ab_i$ on the condition that all the supplementary elements are in the statuses corresponding to that of the supplementary standard except for the supplementary elements "MAXIMUM SIZE" and "MASS".

On the above assumption, definition is made such that the attachment cost $_aC_{bi}$ for the part standard $_ab_i$ is determined through a procedure described below. As the attachment cost $_aC_{xo}$ for the standard element "ATTACHMENT BY DOWNWARD MOVEMENT" (↓) for which all the supplementary elements are in the state of the supplementary standard, the real attachment cost of 1.26 yen for the basic element $_aX$ "ATTACHMENT BY DOWNWARD MOVEMENT" (↓) is read out from the table shown in FIG. 5 in which the supplementary element "MAXIMUM SIZE" is in the status corresponding to that of the supplementary standard (i.e., $l_1=l_0$). Alternatively, the attachment cost of 1.26 yen may be read out in the case where the supplementary element "MASS" is in the status corresponding to that of the supplementary standard (i.e., $m_1=m_0$)

The supplementary coefficient $_a\lambda_{lbi}$ of the supplementary element "MAXIMUM SIZE" of the part standard $_ab_i$ as well as the supplementary coefficient $_a\lambda_{mbi}$ of the supplementary element "MASS" of the part standard $_ab_i$ are then determined in such a manner as follows.

When the class of the supplementary element "MAXIMUM SIZE" to which the "MAXIMUM SIZE" $_al_{bi}$ of the aforementioned part standard $_ab_i$ belongs is, for example, "$l_2$", then the supplementary coefficient $\lambda_{l2}$ for this class "$l_2$" is determined in accordance with an arithmetic expression of "$a_{10}$ $(_al_{bi}-S_1)+1.0$" shown in FIG. 5. On the other hand, when the class of the supplementary element "MASS" to which the mass $_am_{bi}$ of the part standard $_ab_i$ is relevant is, for example, "$m_3$", the supplementary coefficient $\lambda_{m3}$ of the class $m_3$ is determined in accordance with the arithmetic expression of "$a_{13}$ $(_am_{bi}-S_5)+b_{12}$" (where $a_{13}$, $S_5$ and $b_{12}$ represent constants, respectively), which expression is also shown in FIG. 5.

Thus, the attachment cost $_aC_{bi}$ of the part standard $_ab_i$ can be given by the following expression (5):

$$_aC_{bi}=_aC_{xo} \cdot _a\lambda_{lbi} \cdot _a\lambda_{mbi} \qquad (5)$$

Next, the attachment cost $_aC_i$ of the part i mentioned above is determined as well. Assuming that the designed article or product is assembled by performing sequentially the attachment works represented by at least one basic element $_aX_{ij}$ on the part i, the attachment cost $_aC_i$ of the part i is given by a sum of the costs $_aC_{ij}$ involved in the attachment works represented by the basic elements $_aX_{ij}$, respectively. Representing the supplementary coefficients of the individual supplementary elements $_aX_{ni}$ for the part i by $_a\lambda_{li}$, $_a\lambda_{mi}$, $_a\theta_{ij}$, ..., respectively, the attachment cost $_aC_i$ of the part i is given by the following expression (6):

$$_aC_i = \sum_{j=1}^{t} {_aC_{ij}} = \sum_{j=1}^{t} {_aC_{xij} \cdot _a\lambda_{li} \cdot _a\lambda_{mi} \cdot _a\theta_{ij} \cdots} \qquad (6)$$

where $_aC_{xij}$ represents the attachment cost when the basic element $_aX_{ij}$ corresponding to the j-th work performed on the part i is realized in the state where all the supplementary elements are in the status corresponding to that of the supplementary standard.

In the case where the attachment cost $_aC_i$ of the aforementioned part i increases beyond the attachment cost $_aC_{bi}$ of the part standard $_ab_i$ mentioned previously, the part attachability evaluation score of the part i is defined by a function formula according to which a predetermined value or score "100" is decreased by a value which is, for example, in proportion to the extent by which the attachment cost $_aC_i$ exceeds the standard attachment cost $_aC_{bi}$. The above-mentioned function formula may be defined as follows:

$$_aE_i=100-_ae_i=100-_ag_1(_aC_i) \qquad (7)$$

where $_ae_i$ represents a part elimination score which is given by $$_ae_i=a_{20} \, (_aC_i/_aC_{bi})+b_{20} \qquad (8)$$

where $a_{20}$ and $b_{20}$ represent constant, respectively.

The above expression (8) defining the part elimination score is modified as follows.
(i) The expression of the basic elimination score $_a\epsilon_x$ given by the expression (1), i.e., $$_a\epsilon_x=a_1(_aC_x/_aC_{xo})+b_1 \qquad (9)$$

is modified with regard to $_aC_x$, then $$_aC_x=_aC_{xo} \, (_a\epsilon_x-b_1)/a_1 \qquad (10)$$

The cost $_aC_x$ determined by the above expression (10) represents the attachment cost involved in realizing one basic element $_aX$ on the presumption that all the supplementary elements are in the status corresponding to that of the supplementary standard, while $_aC_{xo}$ represents the attachment cost involved in realizing the standard element $_aX_0$ on the condition that all the supplementary elements are in the status of the supplementary standard.

Thus, the expression (6) can be rewritten as follows:

$$_aC_i = \sum_{j=1}^{t} {_aC_{ij}} \qquad (11)$$

$$= \sum_{j=1}^{t} (_aC_{xo}/a_1) \cdot (_a\epsilon_{xij}-b_i) \cdot _a\lambda_{li} \cdot _a\lambda_{mi} \cdot _a\theta_{ij} \cdots$$

where $_a\lambda_{li} \cdot _a\lambda_{mi} \cdot _a\theta_{ij} \cdots$ represents the supplementary element of the basic element $_aX_{ij}$ corresponding to the j-th work performed on the part i. (ii) By substituting the expressions (11) and (5) for the expression (8), the part elimination score $_ae_i$ can be expressed as follows:

$$_ae_i = a_{20} \left\{ \sum_{j=1}^{t} (_aC_{xo}/a_1) \cdot (_a\epsilon_{xij}-b_i) \cdot _a\lambda_{li} \cdot _a\lambda_{mi} \cdot _a\theta_{ij} \cdots \right\} / \qquad (12)$$

$$(_aC_{xo} \cdot _a\lambda_{lbi} \cdot _a\lambda_{mbi}) + b_{20}$$

Reducing the above expression in respect to the common terms, then $$_ae_i = \left\{ a_{20} \sum_{j=1}^{t} (_a\epsilon_{xij}-b_i) \cdot _a\lambda_{li} \cdot _a\lambda_{mi} \cdot _a\theta_{ij} \cdots \right\} / \qquad (13)$$

$$(a_1 \cdot _a\lambda_{lbi} \cdot _a\lambda_{mbi}) + b_{20}$$

Thus, it is apparent that the part elimination score $_ae_i$ of the part i can be determined on the basis of the basic elimination score $_a\epsilon_{xij}$ of the individual basic elements $_aX_{ij}$ involved for attaching the part i as well as the supplementary coefficients ($_a\lambda_{li}$, $_a\lambda_{mi}$) thereof and the supplementary coefficients ($_a\lambda_{lbi}$, $_a\lambda_{mbi}$) of the part standard $_ab_i$ of the part i in accordance with the aforementioned expression (13). As a result of this, the part attachability evaluation score $_aE_i$ of the part i can be determined in accordance with the expression (7) mentioned hereinbefore. Parenthetically, the part attachability evaluation score $_aE_i$ represents the index which indicates the degree of easiness of the work performed for attaching the part.

At this juncture, it should be mentioned that in place of the function formula (7), the part attachability evaluation score $_aE_i$ may equally be defined by a functional formula which increases the part elimination score from the predetermined score point (e.g. 100), as follows:

$$_aE_i=100+_ae_i=100 +_ag_2 (_aC_i) \quad (14)$$

In this case, however, the part attachability evaluation score $_aE_i$ represents an index which indicates the degree of difficulty of the work required for attaching the part.

Now, the article assemblability evaluation score $_aE$ can be determined on the basis of the part attachability evaluation scores $_aE_i$ of all the parts which constitute a designed article or product of concern.

At this juncture, "article standard (also referred to as the product standard)" $_ab$ is defined similarly to the "part standard" $_ab_i$. It is assumed that the article standard $_ab$ is composed of part standards $_ab_i$. Further, the assembling cost $_aC_b$ of the article standard $_ab$ is defined as being represented by a total sum $\Sigma_a C_{bi}$ of the attachment costs $_aC_{bi}$ of the part standards $_ab_i$. Similarly, the assembling cost $_aC$ of the article or product is represented by a total sum $\Sigma_a C_i$ of the attachment costs $_aC_i$ of all the parts i constituting the article or product.

In the case where the assembling cost $_aC=\Sigma_a C_i$ of the article or product exceeds the assembling cost $_aC_b=\Sigma_a C_{bi}$ of the article standard $_ab$, the article assemblability evaluation score $_aE$ of the article or product of concern is defined by a function formula which decreases the article assemblability evaluation score $_aE$ from a predetermined score point (e.g. "100") by a value which is in proportion to the extent by which the article assembling cost $_aC$ exceeds that of the article standard $_ab$. Thus, the function formula mentioned above can be defined as follows:

$$_aE=100-_ae=100-_ag_3 (_aC) \quad (15)$$

where $_ae$ represents an article elimination score given by:

$$_ae=a_{30} (_aC /_aC_b)+b_{30} \quad (16)$$

where $a_{30}$ and $b_{30}$ represent constants, respectively.

By substituting $_aC=\Sigma_a C_i$ and $_aC_b=\Sigma_a C_{bi}$ for the expression (16), the latter can be rewritten as follows:

$$_ae=a_{30} (\Sigma_a C_i/\Sigma_a C_{bi})+b_{30}$$

From the expressions (10) and (5), the above expression can be rewritten as follows:

$$_ae= \left\{ a_{30} \sum_{i=1}^{r}\sum_{j=1}^{t} (_a\epsilon_{xij}-b_i) \cdot _a\lambda_{li} \cdot _a\lambda_{mi} \cdot _a\theta_{ij} \cdots \right\} / \left( a_1 \sum_{i=1}^{r} _a\lambda_{lbi} \cdot _a\lambda_{mbi} \right) + b_{30} \quad (17)$$

Thus, it is apparent that the article elimination score $_ae$ of an article or product can be determined in accordance with the above expression (17) on the basis of the basic elimination scores $_a\epsilon_{xij}$ of the individual basic elements $_aX_{ij}$ involved in attaching the individual parts which constitute the article or product of concern, the individual supplementary coefficients ($_a\lambda_{li} \ldots$), and the individual supplementary coefficients ($_a\lambda_{lbi}, _a\lambda_{mbi}$) of the part standards $_ab_i$ of the individual parts i. As a result of this, the article assemblability evaluation score $_aE$ can be determined in accordance with the expression (15).

The article assemblability evaluation score $a^E$ represents an index which indicates the degree of easiness in assembling a designed article or product of concern.

The design engineer can quantitatively evaluate his or her design plan at an earlier stage of design as to whether a structure is favorable with respect to the assemblability by determining the part attachability evaluation scores $_aE_i$ and the article assemblability evaluation score $_aE$, respectively.

Furthermore, the design engineer can predict the estimate values of the part attachment costs and the article assembling cost on the basis of real values stored in precedence as the data.

At first, by substituting the expression (8) for the expression (7), the part attachment cost can be given by $$_aC_i=_aC_{bi} (100-b_{20}-_aE_i)/a_{20} \quad (18)$$

From the expression (5), the above expression (18) can be rewritten as follows:

$$_aC_i=_aC_{x0} \cdot _a\lambda_{lbi} \cdot _a\lambda_{mbi}(100-b_{20}-_aE_i)/a_{20} \quad (19)$$

Thus, by placing in the above expression (19) the part attachability evaluation scores $_aE_i$ of the parts i drawn in a design plan, the attachment costs $_aC_{xij}$ associated with the individual basic elements $_aX_{ij}$ and the individual supplementary elements ($_a\lambda_{lbi}, _a\lambda_{mbi}$) associated with the part standards $_ab_i$, the estimated value of the part attachment costs $_aC_i$ can be obtained.

Furthermore, the article assembling cost $_aC$ can be determined as $$_aC= \sum_{i=1}^{r} {_aC_i}.$$

Next, description will turn to a processability evaluation method according to another embodiment of the invention.

FIG. 6 shows a table listing therein work elements classified in terms of basic elements $_mX$. Parenthetically, FIG. 6 corresponds to FIG. 4 which shows the basic elements $_aX$ adopted in the assemblability evaluation method.

The basic elements $_mX$ employed in the processability evaluation method represent elementary processing works as classified, wherein a processing for finishing a plane P which is easiest to work is defined as the basic element $_mX_0$. The basic elimination score $\epsilon_x$ assigned to this processing element or basic element is defined as zero ("0").

The basic elimination scores for the other basic elements are defined by such a functional relation that as the processability of the basic elements $_mX$ becomes more difficult than the standard element $_mX_0$, i.e., as the processing cost $_mC_x$ for each of the basic element $_mX$ such as shown in FIG. 6 in a column labelled "BASIC ELEMENT" increases beyond the processing cost $_mC_{x0}$ for the standard element $_mX_0$ on the condition that the number of products to be manufactured and manufacturing means such as processing machines or tools as used, namely the manufacturing environmental conditions have been established, the basic elimination score $_m\epsilon_x$ of the other basic element than the standard element $_mX_0$ becomes greater than "0" (zero). Thus, the functional relation may be defined, for example, as follow:

$$_m\epsilon_x=a_{40} (_mC_x/_mC_{x0})+b_{40} \quad (20)$$

where $a_{40}$ and $b_{40}$ represent constants, respectively.

Alternatively, it is possible to employ a processing time $_mT_x$ of the other basic elements $_mX$ than the standard element together with a processing time $_mT_{x0}$ of the standard element $_mX_0$ to thereby define the basic elimination score, as follows:

$$_m\epsilon_\chi = a_{41}(_mT_{\chi'}/_mT_{\chi 0}) + b_{41} \quad (21)$$

FIG. 7 shows examples of supplementary elements $_m\chi$ adopted in the processability evaluation method. As the supplementary element $_m\chi$, there may be mentioned a material m, finishing precision a, size (maximum size of a surface to be finished) l, etc. The statuses of each of the supplementary elements (m, a, l, ...) are classified into n items or classes, as in the case of the assemblability evaluation method described hereinbefore by reference to FIG. 5. In conjunction with the supplementary element "MATERIAL", the supplementary standard is defined as the class "COPPER", while for the supplementary element "FINISHING PRECISION", the supplementary standard is defined as the class "ROUGH FINISHING" (∇). Further, for the supplementary element "SIZE (maximum size of a surface to be finished)"l, the supplementary standard belongs to the status class in which the maximum size of the surface to be finished lies within a range of "0 (zero)" to $S_{10}$. The supplementary coefficients $_m\alpha$ of the individual supplementary elements $_m X$ can be determined in accordance with a method similarly to the method for determining the supplementary coefficients $_a\alpha$ used in the attachability/assemblability evaluation method. Furthermore, a part standard is also provided as in the case of the attachability/assemblability evaluation method.

By way of example, as the part standard $_m b_i$ for the processing work of a given part i, there is defined a virtual part having a circular plane surface of the diameter $1/_m l_b$ (where $_m l_b$ represents a positive constant) of the maximum size of the surfaces of the aforementioned part i to be finished.

It is assumed that the part standard $_m b_i$ is subjected to the processing work on the condition that all the other supplementary elements than the supplementary element "SIZE (i.e., maximum size of the surface to be processed or finished)" are in the state of the supplementary standard.

Furthermore, it is presumed that the part i is subsequentially subjected to a series of the processing works which can be represented by at least one basic element $_mX_{ij}$ (where j=1 to t with t being a positive integer) to thereby complete the part starting from a raw material. Accordingly, the processing cost $_mC_i$ for the part i can be given by a total sum of the processing costs of the individual basic elements $_mX_{ij}$. A processability elimination score $_me_i$, a part processability evaluation score $_mE_i$, an article elimination score me and an article processability evaluation score $_mE$ are determined in similar manners as in the case of the part elimination score $_me_i$, the part attachability evaluation score, the article elimination score $_ae$ and the article assemblability evaluation score $_aE$ described hereinbefore.

FIG. 8 shows, by way of example only, an assemblability evaluation process executed by a computer system.

In a step 81, design engineer determines assumptively the order in which parts constituting a designed article or product under evaluation are to be attached, presumes one or plural attachment works or operations j (j=1 to t) for each of the parts i (i=1 to r) in accordance with the orderly attachment steps i (i=1 to r) and extracts all of the basic elements $X_{ij}$ representing the individual attachment works or operations j and the relevant supplementary elements $\chi_{nij}$ as well as the maximum size and the mass (weight) which are inputted to the evaluation system 14 shown in FIG. 1.

In a step 82, the evaluation system determines the part standards $_ab_i$ for the parts i, respectively.

In a step 83, the basic elimination score $\epsilon_{xij}$ of the attachment works or operations j of the individual parts and the supplementary coefficients $\alpha_{nij}$ are read out from the evaluation information database 23 or calculated in accordance with the arithmetic expressions shown in FIG. 5.

In a step 84, the supplementary coefficients $\lambda_{\bar{w}i}$ and $\lambda_{mbi}$ of the part standards $_ab_i$ for the individual parts i are calculated in accordance with the relevant arithmetic expression shown in FIG. 5.

In a step 85, the part elimination scores $_ae_i$ of the parts i is calculated in accordance with the expression (13) mentioned hereinbefore.

In a step 86, the part attachability evaluation score $_aE_i$ of the individual parts i are calculated in accordance with the expression (7) mentioned previously.

In a step 87, the article or product elimination score $_ae$ is calculated in accordance with the expression (17) mentioned previously, and then the article assemblability evaluation score $_aE$ is calculated in accordance with the expression (15).

In a step 88, estimated values $_aC$, $_aC_i$ of the assembling cost and the attachment costs of the article and the parts i, respectively, the article are determined on the basis of the article assemblability evaluation score $_aE$ and the part attachability evaluation score $_aE_i$ in accordance with the expression (19), etc. Alternatively, estimated values of the assembling time $_aT$ and the attachment time $_aT_i$ are calculated.

In a step 89, results are displayed on the display unit 24 and printed out by the printer 15.

Figure 9A:
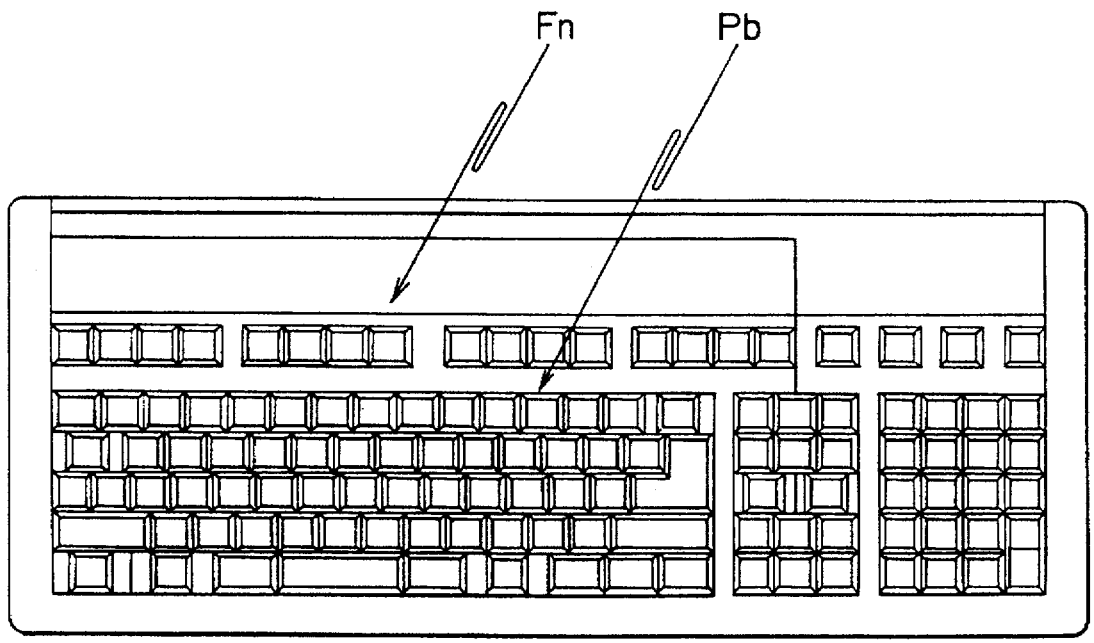
FIG. 9A is a top plan view showing a keyboard array which may be adopted in an evaluation system according to the invention.
Figure 9B:
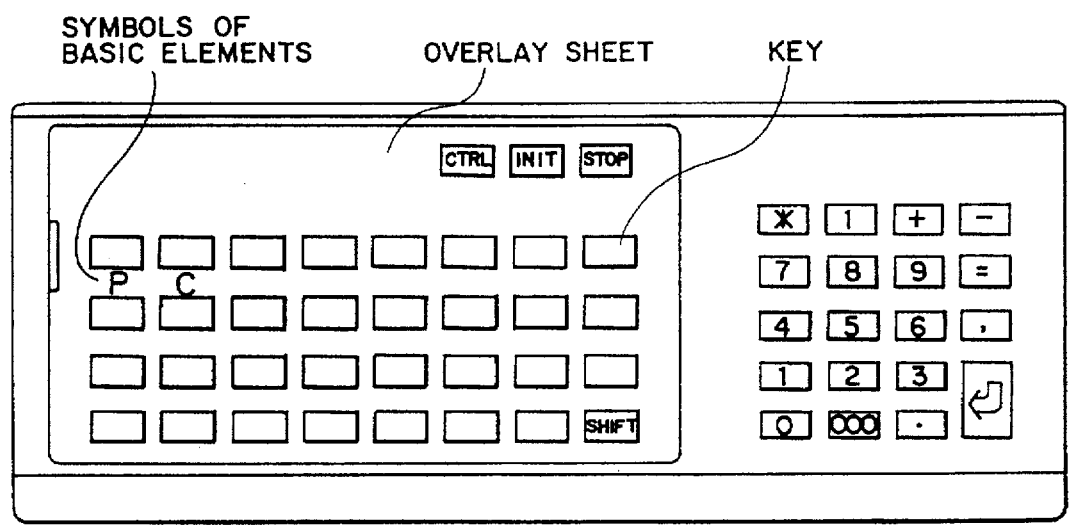
FIG. 9B is a top plan view showing another keyboard array which may be adopted in an evaluation system according to the invention.

In conjunction with the inputting of the basic elements and the supplementary elements as the input data on a part-by-part basis, it is preferred to assign the symbols of the basic elements and the supplementary elements to individual keys of the keyboard, respectively. In FIGS. 9A and 9B, examples of such keyboard are illustrated. In that case, the keys should preferably be assigned with the symbols shown in FIGS. 4 and 6 such that the characters imprinted on the keys can facilitate association with the symbols. By way of example, the symbols of the basic elements for which the alphabetic letters are used as they are may be assigned to the keys of the same alphabetic letters, respectively, while the basic elements for which other symbols than the alphabetic letters are used may preferably be assigned to the function keys. By way of example, a key "S" shown in FIG. 9A may be assigned to the standard element. Alternatively, a sheet known as an overlay sheet may be laid over the keyboard, and relevant symbols may be written on the sheet at locations close to the individual keys, as illustrated in FIG. 9B, so that the symbol of the elements assigned to the keys can immediately be understood. As another alternative, a list of the element symbols may be generated on a display screen, wherein the element symbol as desired may be selected by designating with a cursor. In this manner, there may occur various methods for inputting the symbols of the elements, and any suitable one may be adopted to this end. Parenthetically, the numerical data may be inputted by using the so-called ten-keys.

In the case of the illustrated embodiment, the basic elements "P" are assigned to the keys belonging to a group Pb shown in FIG. 9A, while the other symbols than the alphabetic letters are assigned to the keys belonging to a function key group Fn. Alternatively, a list of the element symbols may be generated on a display screen, wherein the element symbol as desired may be selected by designating with a cursor by means of a pointing device or the like. In this manner, there may occur various methods for inputting the symbols of the basic elements, and any suitable one may be adopted to this end. Needless to say, the numerical data may be inputted by using the ten-keys.

FIG. 15 illustrates, by way of example, the output generated as a result of the processing of the input data by the computer system shown in FIG. 1.

Figure 16:
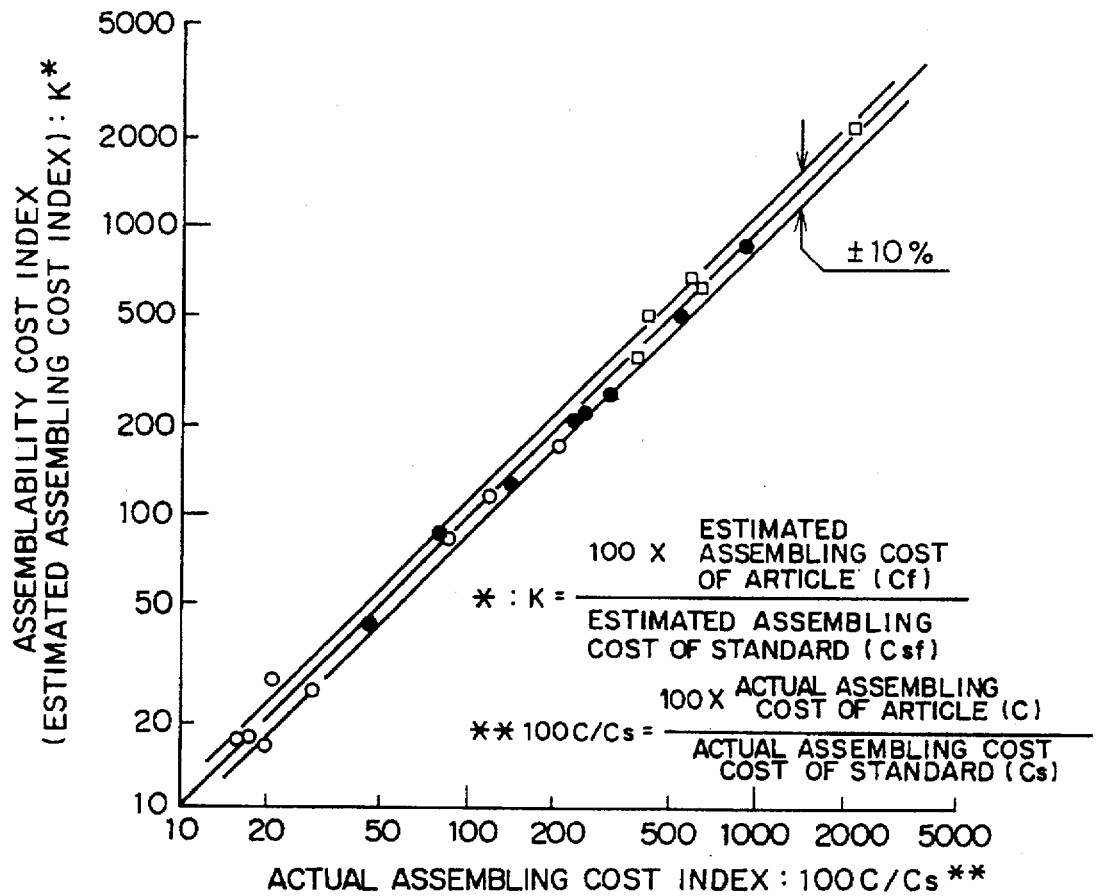
FIG. 16 is a view showing results of verification of accuracy of assembling cost calculation based on an assemblability evaluation method.

FIG. 16 is a view showing the results of evaluation performed concerning the attachability of various parts in accordance with teachings of the invention incarnated in the illustrated embodiment. It can further be seen that errors or deviations from the real values of the assemblability evaluations of the products are confined to within ±10 %.

In the case of the exemplary embodiments described above, the assemblability and processability evaluation scores are determined by adopting a low-point method of scoring (i.e., method of reducing or subtracting the score) from the standard score of "100". However, various modifications of this method of scoring are conceivable such as those exemplified by a method of determining the assemblability and processability evaluation scores by using the low-point method of scoring from the standard score of "0" (zero), method of determining the assemblability and processability evaluation scores according to a high-point method of scoring from the standard score of "0", a method of determining the assemblability and processability evaluation scores by the high-point method on the basis of the standard score of "100" and others. These methods can be realized in the substantially same manner as that described hereinbefore.

Here, the meaning of the elimination score will be elucidated in more concrete.

The fact that a part or an article has gained a high or good evaluation score means that the attachment cost, the processing cost or the assembling cost of the part or the article or product is low for the size thereof and thus there remains little room or potential for the possibility of further improvement.

By contrast, the fact that a part or an article has gained a low evaluation score means that there still remains enough room for improvement for reducing the attachment or processing cost and thus profits brought about by the improvement can be expected with a small deal of labor or that the potential for improvement is high.

FIG. 17 illustrates examples of evaluation and improvement realized by the processability evaluation method according to the teaching of the present invention.

Incidentally, the assemblability evaluation method is discussed by several of the present inventors in Miyakawa et al's article entitled "The Hitachi New Assemblability Evaluation Method (AEM)" contained in Transactions of the North American Manufacturing Research Institute of SME (1990, pp. 352–359) held May 23 to 25, 1990 at Pennsylvania State University, the disclosure of which is hereby incorporated by reference.

Through the procedures described above, the processing works such as, for example, machining of parts as well as the assembling work of a product or article (encompassing the part attachment work) can be evaluated for different kinds of works as involved, independent of one another. However, synthetic evaluation for both the processing work and the attaching/assembling work can not be made simply by adopting straightforwardly the evaluation procedures described in the foregoing. In order to make it possible to perform the synthetic evaluation, the individual works such as the processing or machining work and the attaching/assembling work may synthetically be combined to a more general kind of work such as what may be referred to as the synthetic work such as manufacturing work, whereon synthetic work evaluation may be performed by defining the basic elements $_TX$, the supplementary elements $_T\chi$ (the prefix "T" is to replace the previously used "m") etc. for the combined or synthetic work (e.g. manufacturing work including a processing work and an assembling work) in the same manner as in the case of the processability evaluation and the attachability/assemblability evaluation. However, intolerably lots of time and labor will be required to define the basic elements $_TX$, the supplementary element $_T\chi$ and others for the synthetic work after having defined individually the basic elements $_mX$, $_aX$, the supplementary elements $_m\chi$, $_a\chi$ and others for the processing work and the assembling work, respectively, for the analyses thereof with the aid of these elements and then perform the synthetic analyses by collecting and/or arithmetically determining the data corresponding to the basic element $_TX$ and the supplementary elements $_T\chi$ involved in the synthetic work for thereby determining the basic elimination score $_T\epsilon_X$ and the supplementary coefficient $_T\alpha_n$ for the synthetic work. Under the circumstances, it is proposed according to another aspect of the invention to arithmetically determine the synthetic evaluation scores (which may also be referred to as the manufacturability evaluation scores) $_TE_i$ and $_TE$ on the basis of the basic elements $_mX$, $_aX$, the supplementary elements $_m\chi$, $_a\chi$ for the processing and attaching/assembling works without resorting to the use of the basic elements $_TX$ and the supplementary elements $_T\chi$ dedicated for the synthetic work.

More specifically, a part standard $_Tb$ for the synthetic work (meaning and encompassing a plurality of different kinds of works such as the manufacturing or production work including the processing and attaching/assembling works) of a part i is defined as a combination of the part standards $_mb$ and $_ab$ in different kinds of works, whereon the synthetic or total working cost $_TC_{bi}$ for the part standard $_Tb$ is defined as a sum of $_mC_{bi}$ and $_aC_{bi}$, while the total working cost $_TC_i$ for the parts i is defined as a sum of $_mC_i$ and $_aC_i$ with the total or synthetic working cost $_TC = \Sigma_i C_i$ of an article or a product being then given by $_TC = _mC + _aC$. On these conditions, a synthetic part evaluation score (e.g. part manufacturability evaluation score) $_TE_i$ can be determined in accordance with the previously mentioned expressions for determining the part processability evaluation score $_mE_i$ through a modification of replacing the prefix "m" by "T", as follows:

$$_TE_i = 100 \pm _T e_i \quad (22)$$
$$= 100 \pm _T g_1((_T C_i))$$
$$= _T f_2(_T C_i)$$
$$= _T f_2(_m C_i + _a C_i)$$
$$= _T f_2\{_m f_2^{-1}(_m E_i) + _a f_2^{-1}(_a E_i)\}$$

$$_T e_i = _T g_1(_T C_i) \quad (23)$$
$$= _T g_1(_m C_i + _a C_i)$$
$$= _T g_1(\Sigma_m C_{ij} + \Sigma_a C_{ij})$$
$$= _T g_1[\Sigma\{_m \alpha_{nij} \cdot _m f_1^{-1}(_m \epsilon_{xij})\} +$$
$$\Sigma\{_a \alpha_{nij} \cdot _a f_1^{-1}(_a \epsilon_{xij})\}]$$
$$= _T g_2(_m \alpha_{nij}, _m \epsilon_{xij}, _a \alpha_{nij}, _a \epsilon_{xij})$$

As will be seen from the above, the synthetic evaluation score $_TE_i$ can be calculated on the basis of $_m\epsilon_X$, $_m\alpha_n$, $_a\epsilon_X$, $_a\alpha_n$ or $_mE_i$, $_aE_i$ which can be determined from $_mX$, $_m\chi$, $_aX$, $_a\chi$ without resorting to definitions of the basic elements $T^X$ and the supplementary elements $_T\chi$ for the synthetic evaluation.

The synthetic evaluation score $_TE$ and others except for $_TE_i$ can equally be calculated in accordance with the relations mentioned hereinbefore in conjunction with the processability evaluation by simply replacing the prefix "m" by "T". The major relations are shown below.

$$_TE = 100 \pm {_Te} \quad (24)$$
$$= 100 \pm {_{Tg3}({_TC})}$$
$$= {_{Tf3}({_TC})}$$
$$= {_{Tf4}({_TE_i})}$$
$$= \Sigma {_TE_i}/{_TN}$$
$$= {_T\bar{E}_i}$$

$$_Te = {_{Tg3}({_TC})} \quad (25)$$
$$= {_{Tg3}(\Sigma {_TC_i})}$$
$$= {_{Tg3}[\Sigma\{\Sigma {_{Tg1}^{-1}}({_Te_i})\}]}$$
$$= {_{Tg4}({_Te_i})}$$

$$_TC_i = {_TC_i'}{_{Tf5}({_TE_i}, {_TE_i'})} \quad (26)$$
$$= {_{Tf2}^{-1}({_TE_i})}$$

$$_TC = {_TC'}{_{Tf6}({_TE}, {_TE'})} \quad (27)$$
$$= {_{mf3}^{-1}({_TE})}$$

In addition to or in place of the synthetic or total working costs $_TC$, $_TC_i$, $_TC'$ and $_TC_i'$, there may be derived the total working time $_TT$, $_TT_i$, $_TT'$ and $_TT_i'$ or indexes therefor such as $_TI$, $_TI_i$, $_TI'$ and $_TI_i'$ or products of the shop allotment rates $_mA_i$, $_mA_i'$, $_aA_i$ and $_aA_i'$ and $_mT_i$, $_mT_i'$, $_aT_i$ and $_aT_i'$, i.e., $\Sigma(_mA_i'_mT_i + _aA_i'_aT_i)$, $_mA_i'_mT_i + _aA_i'_aT_i$, $\Sigma(_mA_i'_mT_i' + _aA_i'_aT_i')$ and $_mA_i'_mT_i' + _aA_i'_aT_i'$.

Figure 18:
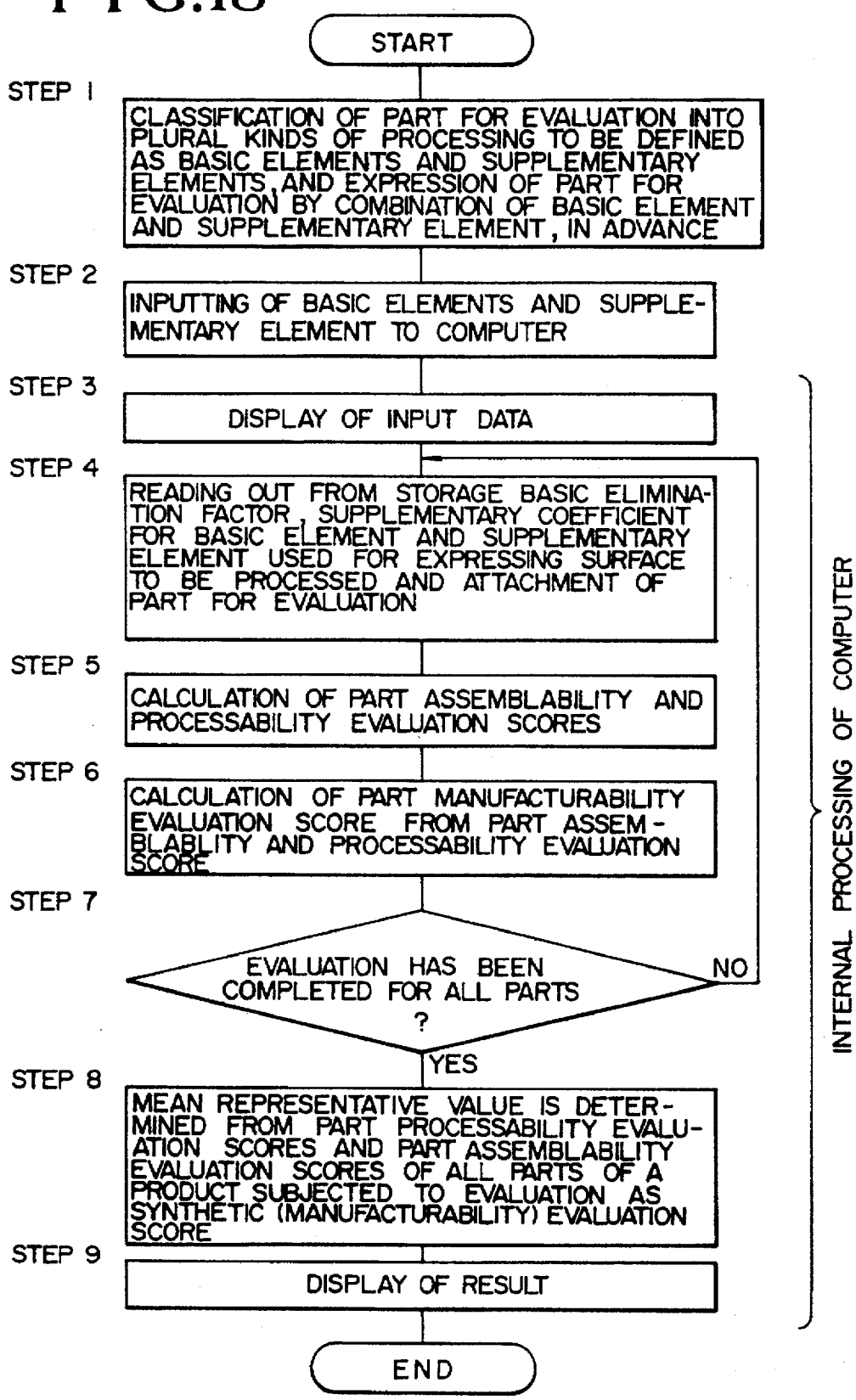
FIG. 18 is a flow chart for illustrating a sequence of processings for executing a processability evaluation, an attachability/assemblability evaluation and a synthetic processability/attachability/assemblability evaluation.

FIG. 18 is a flow chart for illustrating, by way of example, a procedure for performing a processability evaluation, an attachability/assemblability evaluation and a synthetic evaluation by using the basic elements and the supplementary elements of constituent parts with the aid of a computer system. Referring to FIG. 18, in a step 1, those parts which are subjected to evaluation are expressed by combinations of symbols representing the relevant basic elements and supplementary elements, respectively. In this case, unless the symbols representing exactly the basic and supplementary elements are available, those bearing the best similarity to the symbols for the basic and supplementary elements under evaluation are selected. In a step 2, data of the symbols of the basic elements and the supplementary elements such as $_mX_{ij}$, $_mX_{ij}$, $_aX_{ij}$, $_aX_{ij}$ as well as the number $m_i$ of the parts i used in an article or product of concern are inputted through the keyboard or the like of the input unit 4. The succeeding processings and operations are executed internally by the computer. In a step 3, the data inputted through the keyboard are displayed on a screen of the display unit 3. In a step 4, there are read out from the tables shown in FIGS. 4, 5, 6 and 7 stored in the storage unit 2 the basic elimination scores $_m\epsilon_{xij}$, $_a\epsilon_{xij}$ and the supplementary coefficients $_m\chi_{nij}$, $_a\chi_{nij}$ which correspond to the symbols of the basic elements and the supplementary elements used for expressing the surfaces to be processed and the attachment movements of the parts under evaluation, respectively. In a step 5, the part processability evaluation score $_mE_i$ and the part attachability/assemblability evaluation score $_aE_i$ are arithmetically determined in accordance with the expression (14), respectively, on the basis of the basic elimination scores, the supplementary coefficients and other data as read out. The part processability evaluation score $_mE_i$ and the part attachability/assemblability evaluation score $_aE_i$ thus determined are stored in the memory or storage unit. In a step 6, the part synthetic evaluation score (i.e., manufacturability evaluation score) $_TE_i$ is arithmetically determined on the basis of the part processability evaluation score and the part attachability/assemblability evaluation score in accordance with the expression (22), the result of which is stored in the memory. In a step 7, it is checked whether or not the above-mentioned processing step 6 has been performed for all the parts of concern. When the answer of the decision step 7 is negative (No), the processing step 6 is repeated until it has completely been performed for all of the parts. In a step 8, the synthetic evaluation score (article manufacturability evaluation score) $_TE$ is determined in accordance with the expressions (22), (23) and (24) mentioned previously in terms of a mean representative numerical value on the basis of the attachability/assemblability evaluation scores $_mE_i$ for all the parts constituting the product or article of concern and the part processability evaluation scores determined for all the parts to be processed or machined. In a step 9, the results are displayed on the display unit 3 and at the same time outputted through the printer. Parenthetically, it should be mentioned that the computer can be so programmed as to automatically calculate all or a part of the processability evaluation score, the processing time and the processing cost as well as the attachability/assemblability evaluation score, the attachment/assembling time and the attachment/assembling cost on a part-by-part basis or on a product-by-product basis together with the synthetic evaluation score (manufacturability evaluation score), the results of which may of course be displayed on the display unit and/or printed out, as occasion requires.

FIG. 19 shows examples of the data obtained as the result of processings executed by the computer system concerning the processability evaluation score, estimated processing cost, attachability/assemblability evaluation score, estimated attachment/assembling cost, manufacturability or synthetic evaluation score and the estimated manufacturing cost. As will be seen from FIG. 19, there can be obtained as the output data, the part attachability/assemblability evaluation scores and the estimated attachment/assembling costs for all the parts constituting an article or a product of concern, the part processability evaluation scores and the estimated processing costs determined for all the parts subjected to the processability evaluation, the part manufacturability (synthetic) evaluation score and the estimated part production cost together with the article manufacturability evaluation score, estimated manufacturing cost, manufacturability evaluation score, estimated manufacturing cost and the estimated manufacturing cost for the article of concern in terms of the sum values or mean representative values of the corresponding evaluation values and the estimated costs of the constituent parts.

FIG. 21 shows, by way of example, the results of the processability evaluation, the attachability/assemblability evaluation and the processability/attachability/assemblability synthetic evaluation performed by the computer system shown in FIG. 1 for structure models A and B shown in FIG. 20. In the case of the prior art evaluation method illustrated in FIG. 20, it can not be decided which of the structure models A and B is better. In contrast, the processability/attachability/assemblability evaluation method according to the invention renders it possible to determine at once that the structure design A is better, as can be seen from FIG. 21.

Although the foregoing description is directed to the synthetical evaluation of the processability and the attachability/assemblability, it should be understood that the invention can equally be applied to the synthetical evaluation of other kinds of works or operations. It should further be added that the invention can equally be applied to evaluation of various kinds of works or operations such as manufacturing works or operations, inspecting works, transportations, sales activities, installing works or operations, use and maintenance works for evaluating effectively easiness or difficulties thereof, respectively, through substantially same procedure as that described hereinbefore in conjunction with the illustrated embodiments of the invention.

Figure 3:
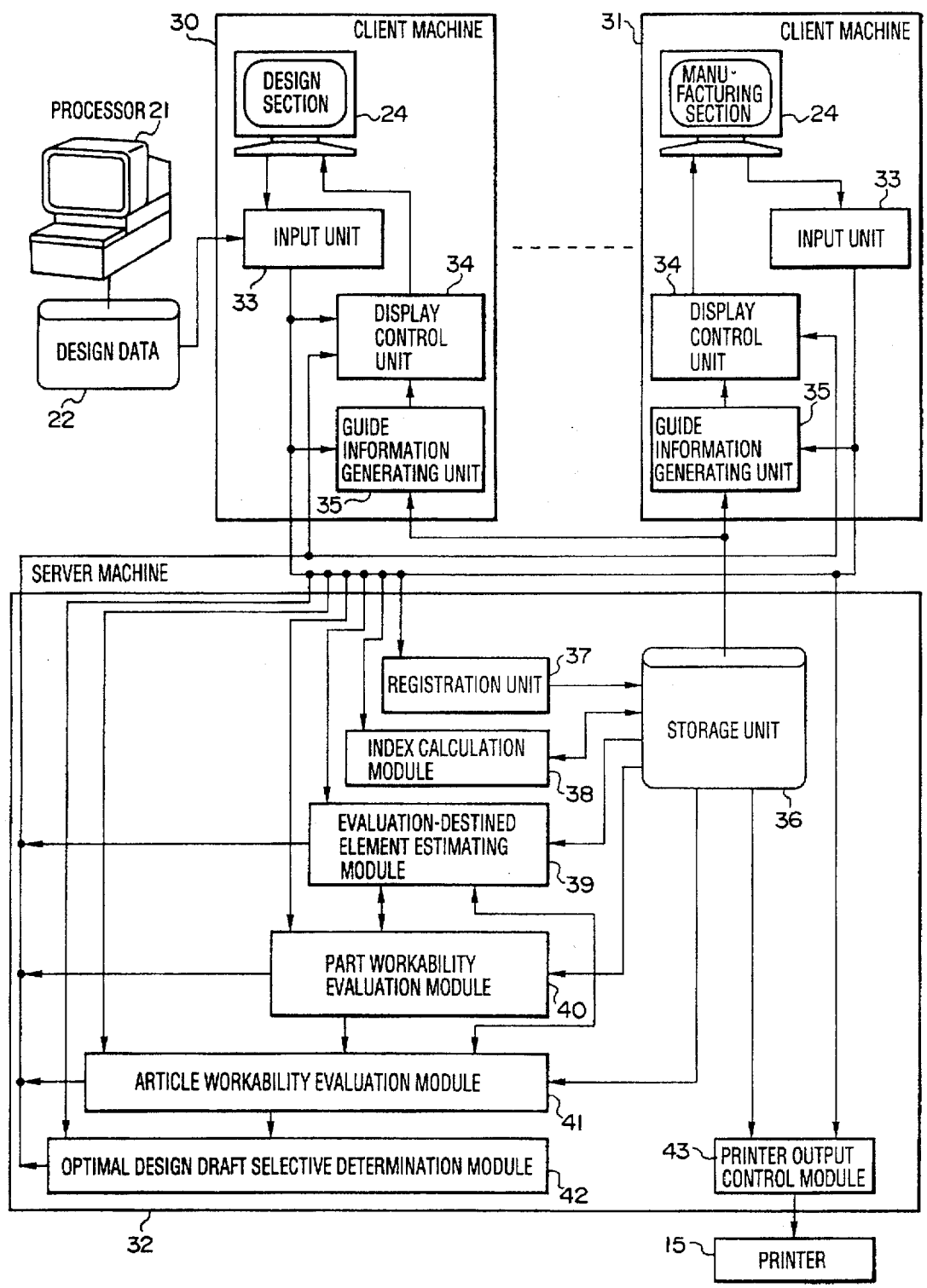
FIG. 3 is a block diagram showing, by way of example, an arrangement of an automatic manufacturability evaluation system in which one server machine section and a plurality of client machine sections are provided separately and interconnected via a communication network.

Next, referring to FIG. 3, description will be directed to exemplary embodiments of the manufacturability evaluation method and system according to the invention.

FIG. 3 is a block diagram showing an arrangement of a manufacturability evaluation system according to an embodiment of the invention. The manufacturability evaluation system is comprised of one or plural client machines 30 and 31 and one server machine 32, which are interconnected via a communication network. Of course, the client machine and the server machine may be implemented in a single integral unit.

Each of the client machines 30 and 31 is comprised of:

a display unit 24, an input unit 33 including a keyboard or the like for inputting instruction such as characters, numerals and the like from the keyboard and/or inputting a variety of instructions/commands information by designating relevant predetermined locations on the display unit 24 by means of a mouse or the like pointing device and/or inputting data from a design database 22 of a CAD processor 21 connected to the system, a guide information generating unit 35 for generating guide information on the display unit 24 for prompting or designating the information which the user is to input in various input modes, and a display control unit 34 for displaying on the display unit 24 a variety of information as well as the guide information generated by the guide information generating unit 35.

On the other hand, the server machine 32 is constituted by a registering unit 37, a storage 36, and an index calculating unit 38, the functions of which will be described below.

In order to carry out the manufacturability evaluation according to the present invention, it is necessary to determine in precedence the real values of the processing costs (and/or time) and the attachment/assembling costs (and/or time) of existing (really manufactured) parts and article or product on the condition that the manufacturing environments are known. Additionally, it is required to determine the various indexes and coefficients used in the various arithmetic operations described hereinbefore on the basis of the aforementioned values. Parenthetically, in conjunction with the collection of the real costs and/or real time mentioned above, it can readily be understood that collections of a greater number of relevant data in the manufacturing environments uniformized as high as possible will enable the manufacturability evaluation to be performed with higher accuracy and reliability.

In the description made hereinbefore in conjunction with the attachability/assemblability evaluation method and the manufacturability evaluation method, it has been assumed that the real values of the works as involved provide the basis for determination of the variable indexes and coefficients. It should however be appreciated that the real values of the time as required for the works may be used as the basis for determination of the indexes, the coefficients and other factors as required. Accordingly, in collecting the real values, it is preferred to select the real costs or real time or both.

Figure 10:
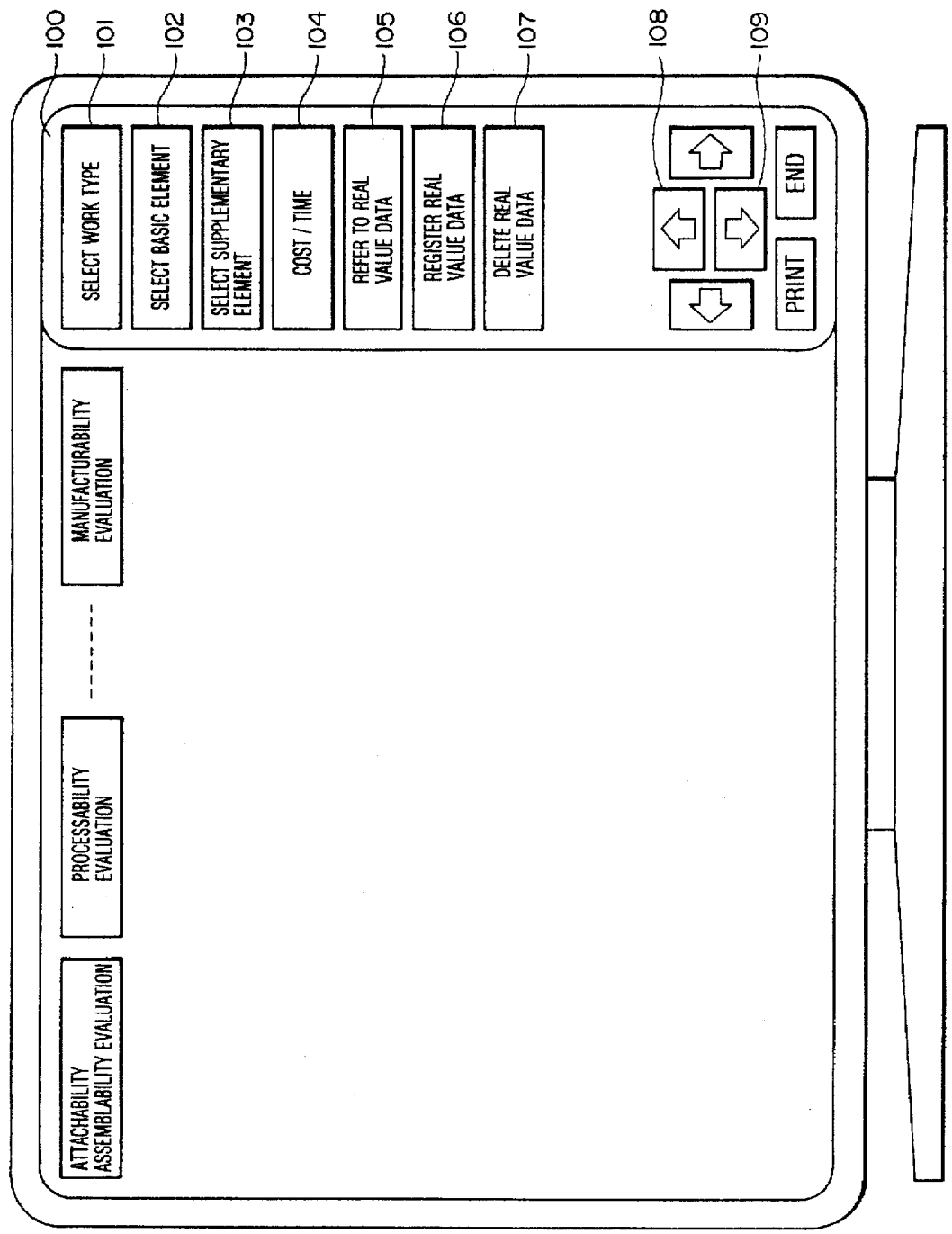
FIG. 10 is a view showing data, guide information and others displayed on a display unit upon selection of a registration mode in a client machine section.

Upon registration of the real values from the client machine 31, the latter is activated to select the registration mode. When the command for selecting the registration mode is inputted through the input unit 33, the guide information generating unit 35 is put into operation to generate an input menu 100, as shown in FIG. 10 at a right side portion thereof. The input menu 100 is then displayed on the design data 24 by way of the display control unit 34. By manipulating the mouse constituting a part of the input unit 33, a cursor on the screen of the display unit 24 is positioned within a frame of a "WORK TYPE SELECT" command 101 of the input menu 100, which is then picked with the mouse. Every time the "WORK TYPE SELECT" command 101 is clicked, the selected work types are changed sequentially to the attachment/assembling work, the processing work and others. When the desired work is selected, the work selecting process comes to an end. In this case, let's assume that the attachment/assembling work has been selected.

Figure 11:
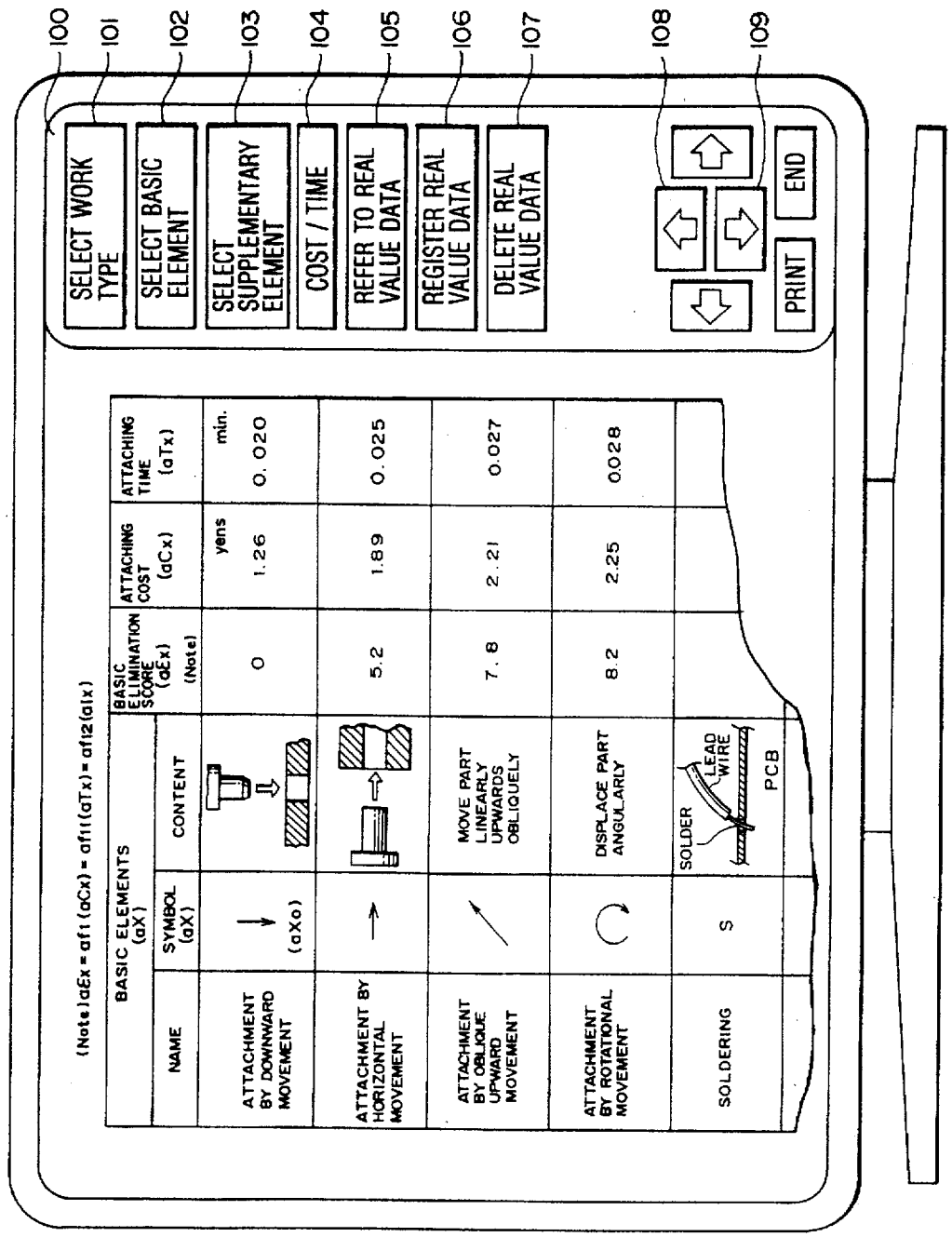
FIG. 11 is a view showing, byway of example, basic element data and others generated on a display unit to be referenced by user.

In succession, upon picking-up of a "BASIC ELEMENT SELECT" command 102 by a mouse, the guide information generating unit 35 reads out the registered data from the storage 36 to display a list of the basic elements for the attachment/assembling works, an example of which is illustrated in FIG. 4, in such a manner as shown in FIG. 11. In the list shown in FIG. 11, there are displayed in the column labeled "ATTACHMENT COST" or "ATTACHMENT TIME" or in both columns the relevant data of costs or time or both in correspondence to the selection made previously by picking a "COST/TIME" command 104 by the mouse. Unless the data concerning the attachment cost concerning the basic element "ATTACHMENT BY HORIZONTAL MOVEMENT" can be found in the registered data, the corresponding row in the relevant column of the list remains blank. Besides, the corresponding row of the column labeled "BASIC ELIMINATION SCORE" remains blank.

Since all the contents of the list shown in FIG. 11 can not be displayed simultaneously but only a portion is displayed, the display of the list of the basic elements is scrolled upwardly or downwardly by picking a "SCROLL-UP" command 108 or "SCROLL-DOWN" command 109 with the mouse.

In the state in which the list of the basic elements shown in FIG. 11 is displayed, the column for either one of the basic element "NAME", "SYMBOL" or "CONTENT" is designated by picking with the mouse.

In succession, by picking a "SUPPLEMENTARY ELEMENT SELECT" command 103 with the mouse, a list of the supplementary elements for the attachment/assembling works illustrated exemplarily in FIG. 5 is displayed in a manner similar to the list of the basic elements shown in FIG. 11. Further, operations similar to those described above by reference to FIG. 11 can be performed on the data contained in the list being currently generated. In the list of the supplementary elements shown in FIG. 12, the column for the class "SYMBOL" or "CONTENT" of the supplementary element to be registered can be designated by picking with the mouse.

Subsequently, by designating and picking a "REAL VALUE DATA REGISTER" command 106, a real value data registration window 120 is displayed on a bottom portion of the screen, within which the basic elements and the supplementary elements already designated as mentioned previously are clearly indicated together with the guide information for prompting the user to input the real cost or real time or both (see FIG. 12).

In response, the user inputs the real value(s) in accordance with the guide information from the input unit 33 such as the keyboard. Then, the "REAL VALUE DATA REGISTER" command 106 is again picked with the mouse for registering the inputted data in the storage 36 by means of the registering unit 37 of the server machine 32.

All the basic elements and the supplementary elements to be designated can be registered through the input unit 33 such as the keyboard for registration. Of course, the real data registered can be referenced in the form of a list. By way of example, by picking with the mouse the column "ATTACHMENT COST $_aC_X$" for the basic element "ATTACHMENT BY HORIZONTAL MOVEMENT" shown in FIG. 11 (in which display of "1.89 yen" is generated) and then picking the "REAL VALUE DATA REFERENCE" command 105, the guide information generating unit 35 retrieves from the real value data registered in the storage 36 only the registered data concerning the attachment cost for the basic element "ATTACHMENT BY HORIZONTAL MOVEMENT" for which all the supplementary elements are supplementary standards, whereon a list of the retrieved data is displayed in such a manner as illustrated in FIG. 13.

Furthermore, after designating the basic element "ATTACHMENT BY HORIZONTAL MOVEMENT" from the list of the basic elements shown in FIG. 11, a list of the supplementary elements is displayed. Subsequently, the "SUPPLEMENTARY ELEMENT SELECT" command 103 is picked up with the mouse for thereby displaying the list of the supplementary elements. In succession, the column labeled "ATTACHMENT COST" for the class "$l_2$" of the supplementary element "MAXIMUM SIZE" (display of "2.27 yens" is being generated) is picked up with the mouse, which is then followed by picking the "REAL VALUE DATA REFERENCE" command 105. Then, the guide information generating unit 35 responds to this command to retrieve from the real value data registered in the storage 36 only the registered data concerning the attachment cost for the basic element "ATTACHMENT BY HORIZONTAL MOVEMENT" for which the supplementary element "MAXIMUM SIZE" belongs to the class "$l_2$" and with all the other supplementary elements being supplementary standards, whereon a list of the retrieved data is displayed in such a manner as illustrated in FIG. 14.

By displaying the lists of concern as described above, it is possible to confirm the data as registered while making sure as to whether the collection of the real value data is sufficient or not.

Parenthetically, display of the lists of the real value data is performed by scrolling the display by picking the "SCROLL-UP" command 108 or the "SCROLL-DOWN" command 109. The old useless real value data as well as those which are unfavorable with respect to the accuracy may be deleted from the list. To this end, the items to be deleted can be selected by picking the real value data No. on the display screen, whereon the "REAL VALUE DATA DELETE" command 107 is picked. Then, the relevant data stored in the storage 36 are deleted by the registering unit 37.

FIGS. 22A to 22D illustrate forms of real value data records stored in the storage 36.

Referring to FIG. 22A, a work type identification record is composed of pointers pointing to basic element record groups for every evaluation method, wherein an attachability/assemblability evaluation basic element pointer 201 indicates an address of a first attachability/assemblability evaluation-destined basic element record. The definition data 204 of the basic element record is composed of data such as name, identification code, identification symbol, content information and other. A pointer 205 indicates other basic element record for the same evaluation method, as can be seen from FIG. 23, while pointers 206 indicate supplementary element records concerning the relevant basic elements for the attachability/assemblability evaluation. Further, the basic element record contains the basic elimination scores $\epsilon_X$ 207, the cost $C_X$ 208, the time $T_X$ 209 and so forth.

A supplementary element record contains in the definition data 210 the names, identification codes identification symbols, contents of the supplementary elements and the information indicating the classes or items as classified, while pointers 211 indicate other supplementary element records concerning the same evaluation method and basic elements, respectively. Further, a pointer 212 indicates a real value sample data record concerning the relevant basic element and supplementary element of concern. Additionally, the supplementary element record contains therein the supplementary coefficient $\alpha$ 213, the cost $C_{X,n}$ 214, the time $T_{X,n}$ 215 and others.

The real value sample data record may be newly added with one record through a single real value data registration processing, while a record can be deleted through the deletion processing.

The real value sample data record contains pointers 216 to other same class real value sample record, data collecting section codes ID 217, registration dates 218, supplementary element real values 219, costs 220, time 221, number of samples 222, remarks 223, etc.

Figure 23:
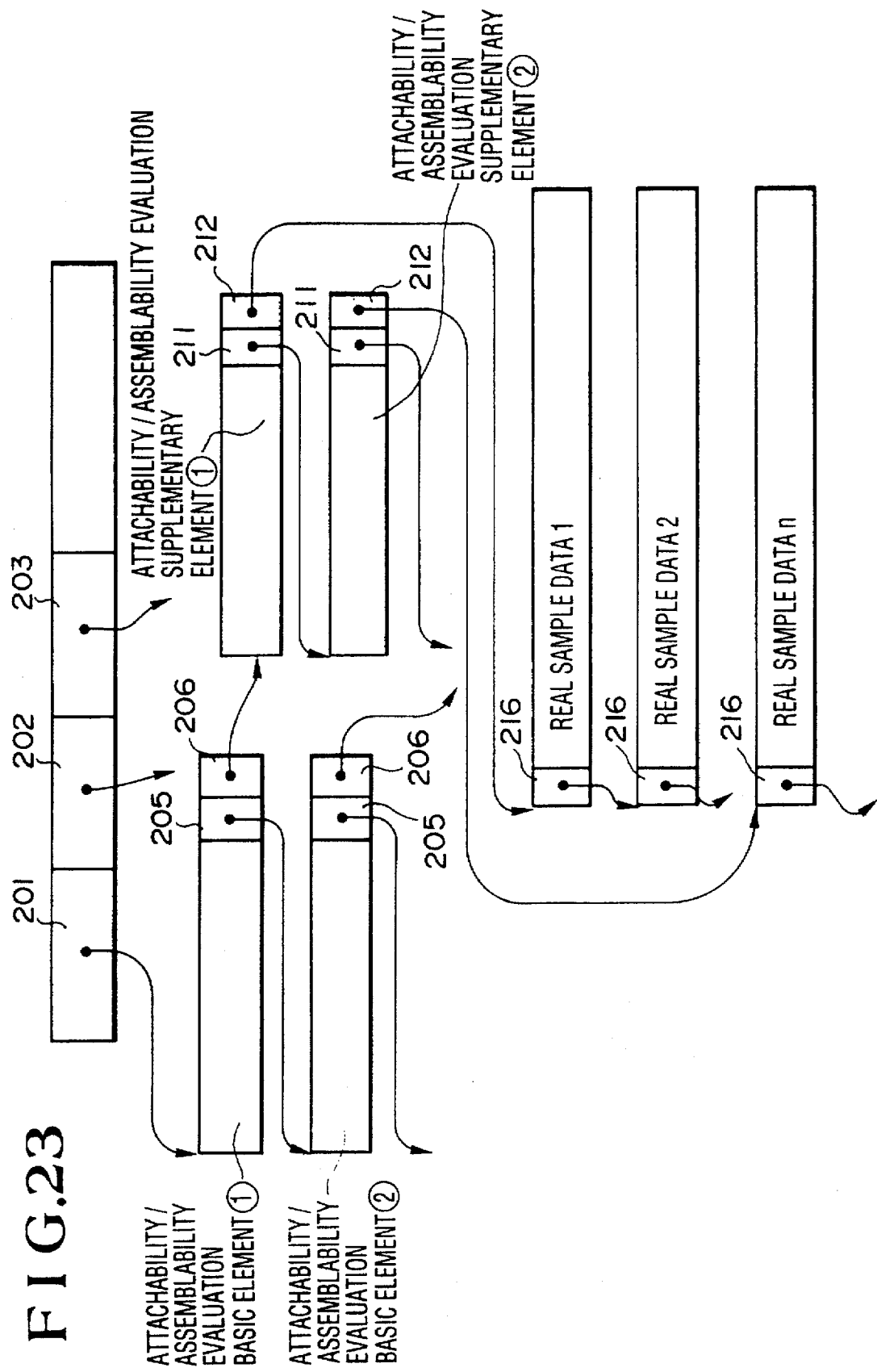
FIG. 23 is a view illustrating a structure of real data record.

FIG. 23 shows a structure of the real value data. As can be seen in FIG. 23, the basic element records for the attachability/assemblability evaluations are sequentially interconnected by the pointers 205, wherein a value assigned to the pointer 205 pointing the last basic element record indicates that there does not exists any further record to be connected.

Similarly, in the case of the supplementary element records, the first record is connected by the pointer to a given basic element record with relevant records being sequentially connected by pointers 211. Furthermore, a first real value sample data record is connected by a supplementary element record pointer 212 while the other relevant real value sample data records are sequentially interconnected by pointers 216.

Figure 12:
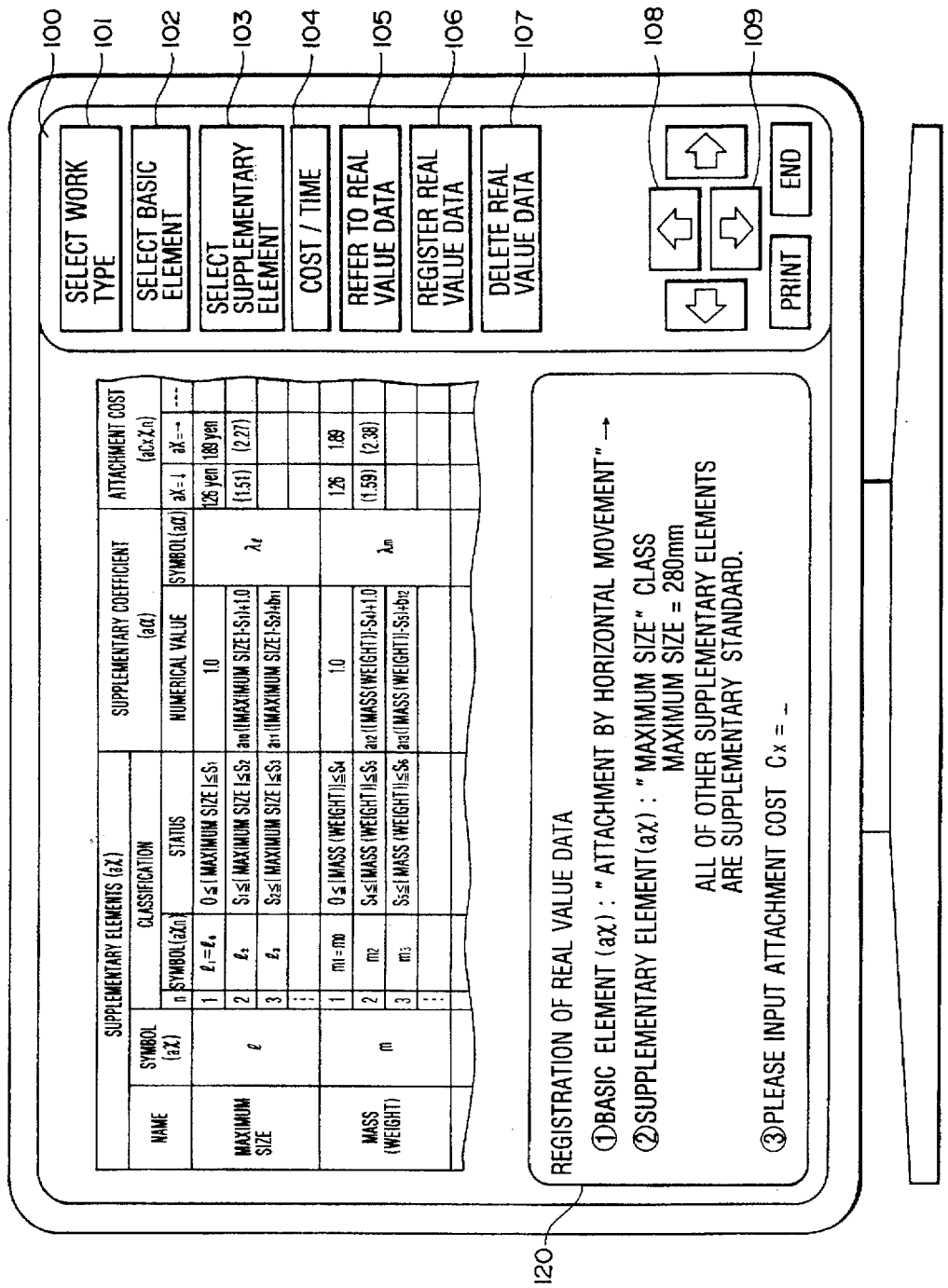
FIG. 12 is a view showing, by way of example, supplementary element data and others generated on the display unit to be referenced by user.

Upon inputting of the real value data through the real value data registration window 120 shown in FIG. 12, the registering unit 37 shown in FIG. 3 generates a relevant real value sample data record in the storage while updating the pointers as required. Further, the processing for deleting the real value data is performed by the registering unit, whereby the relevant real value sample data record is deleted while updating the pointer(s), if necessary.

The index calculating unit 38 shown in FIG. 3 is actuated every time one real value sample data record is registered or deleted, for thereby calculating the indexes only for a group of the records belonging to the same category as the real value sample record registered or deleted, i.e., the records interconnected by the pointer 212, from the real value sample data records stored in the storage 36. The indexes mentioned above are the basic elimination scores $\epsilon_X$ 207 and the supplementary coefficients $\alpha$ 213.

The basic elimination score $\epsilon_X$ can be arithmetically determined in accordance with, for example, the expression (1) or (2) mentioned hereinbefore. Although the expressions (1) and (2) are defined for the attachability/assemblability evaluation, they may be considered as being applicable to those relations which represent other evaluation methods.

At this juncture, it should be mentioned that if the real value sample data record as registered or deleted relates to the standard element $X_0$, the relevant costs $C_{x0}$ stored in the storage 36 at that time point are read out, whereon a mean value thereof is calculated to determine again and update the basic elimination scores $\epsilon_x$ 207 of all the basic element records for the relevant evaluation method on the basis of the values $C_{x0}$.

On the other hand, when the real value sample data record as registered or deleted relates to the other basic elements than the standard element $X_0$, the basic elimination scores $\epsilon_x$ 207 of the relevant basic element record is again calculated to be updated.

The supplementary coefficient $\alpha$ may be calculated in accordance with e.g. the expression (3). In this conjunction, if the real value sample data record as registered or deleted relates to the supplementary standard of a given supplementary element, the relevant data $C_{x_o0}$ stored in the storage 36 are read out to determine a mean value thereof, whereon the supplementary coefficients $\alpha$ 213 of all the supplementary element records for the relevant evaluation method are again calculated and updated on the basis of the value $C_{x_o0}$. If an item or class except for the supplementary standard of the given supplementary element is concerned, the supplementary coefficients $\alpha$213 of all the supplementary element records represented by the definition data thereof are updated by recalculation.

Among the supplementary coefficients, there exists such one as defined by, for example, the arithmetic definition (4). In that case, after calculating the supplementary coefficients values on the basis of "COST" 220 or "TIME" 221 of the real value sample data record, a number of points "SAMPLE NUMBER" 222 are plotted graphically with "SUPPLEMENTARY COEFFICIENT REAL VALUES" 219 being taken along the abscissa with the calculated supplementary coefficient values being taken along the ordinate in a coordinate system having the ordinate along which "SUPPLEMENTARY COEFFICIENT" is taken with the values of the supplementary elements being taken along the abscissa. After having plotted the points in accordance with the real value sample data record for all of the relevant supplementary elements, a solution approximating the group of points by line segments is determined, e.g. by a method of least squares. After determination of the approximating line segments, the values of $a_{10}$ and $S_1$ are determined, when the expression (4), for example, applies valid, whereupon the values as determined are written to the field "SUPPLEMENTARY COEFFICIENT $\alpha$" 213 of the relevant supplementary element record.

In this conjunction, the value of the "BASIC ELIMINATION SCORES $\epsilon_x$" 207 of the basic element of record for the standard elements is set to "0" with the value of "SUPPLEMENTARY COEFFICIENT $\alpha$" 213 of the supplementary element record for the supplementary standards being set to "1.0" as the initial values, respectively, upon generation of these records.

When a design engineer desires to evaluate quantitatively whether or not a structure as designed is easy to implement or manufacture, he or she activates the system from the relevant client machine 30 to thereby set the evaluation mode.

Figure 24:
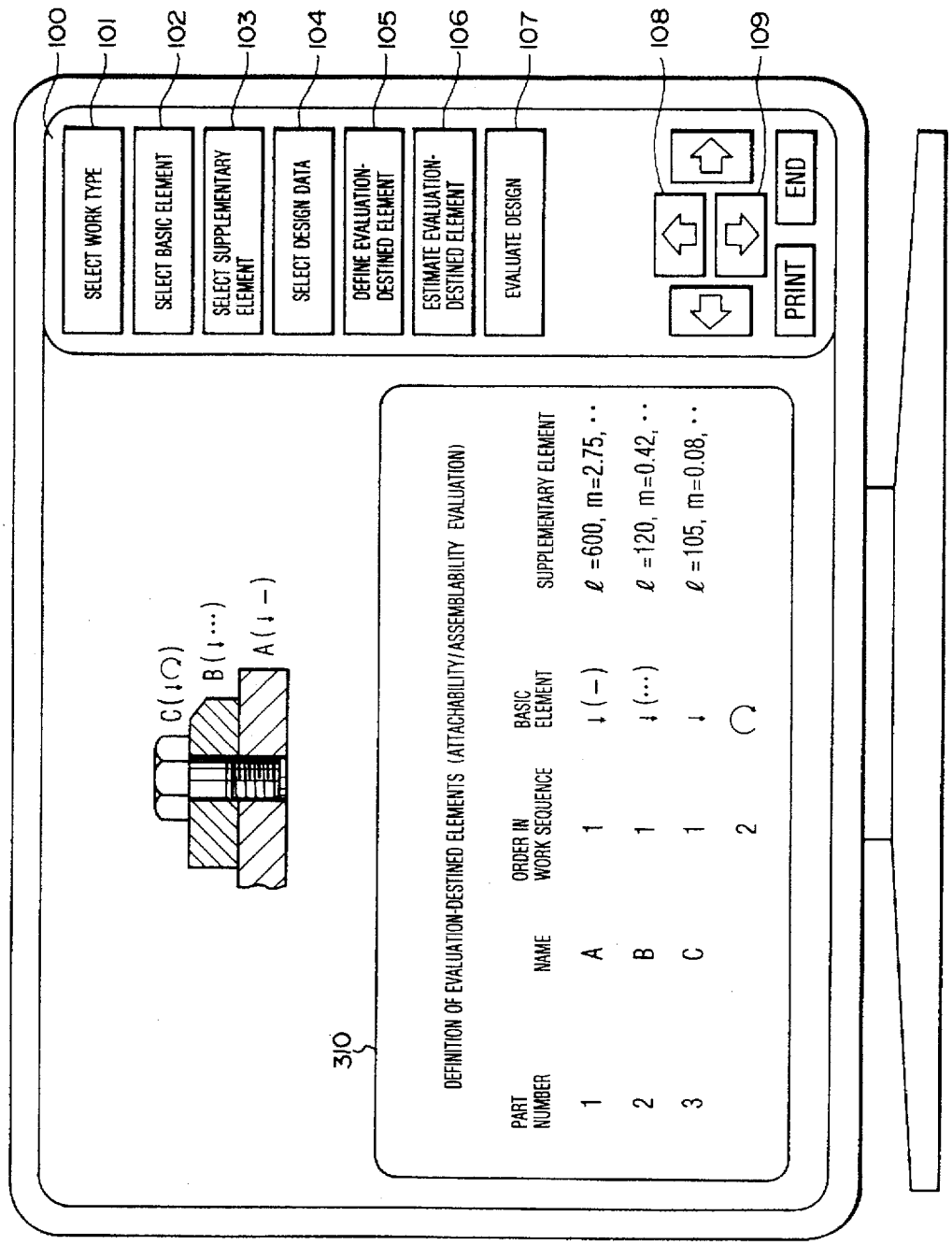
FIG. 24 is a view showing, by way of example, how to define evaluation-destined elements (i.e., elements for evaluation) on a display unit in the case where a evaluation mode is selected in a client machine section.

When the selected evaluation mode is inputted through the input unit 33, the guide information generating unit 35 is activated to generate an input menu 300 at a right-hand side of a display screen shown in FIG. 24, which menu is displayed on the display unit 24 by means of the display control unit 34.

Then, the mouse constituting a part of the input unit 33 is manipulated to position the cursor on the screen to a frame "DESIGN DATA SELECT" command 304 of the input menu 300. In response to activation of this command, the desired design data of those generated by the CAD processor 21 or those of the CAD database 22 storing the design data generated in the past are read out by the input unit 33 by selecting the corresponding item(s) in the menu, whereby the design data are displayed in a two-dimensional or three-dimensional form on the display unit 24 by the display control unit 34. The design engineer is thus capable of defining the parts to be evaluated by positioning the cursor onto the parts of concern sequentially. In this conjunction, it should be mentioned that the part of concern may be a subassembly of parts of a lower rank. The part under evaluation may be distinguished from the other parts by changing, for example, the color of the former from that of the latter.

Subsequently, the design engineer can input a command as to which of the evaluation methods is to be adopted. To this end, the design engineer can pick the "WORK TYPE SELECT" command 301 with the mouse to thereby display an evaluation method selection menu shown in FIG. 10 at the left-hand side. Subsequently, every time the command is picked, the evaluation method to be selected changes from one to another, allowing the design engineer to select the desired evaluation method.

Subsequently, the design engineer examines the works involved in carrying out the selected evaluation method in view of the article or product or the subassembly of concern. More specifically, the design engineer determines in what sequence j what kinds of works are to be done on every constituent parts i and inputs the basic elements $X_{ij}$ and the supplementary elements $\chi_{nij}$ on the part-by-part basis. This input procedure may be started by picking the "EVALUATION-DESTINED ELEMENT DEFINITION" command 305 in the input menu 300 with the mouse. By way of example, the design engineer may designate the individual constituent parts of the article or product under evaluation by the part identification numbers "i" on a part-by-part basis with the mouse and designate the sequence j of the works to be done on the parts i to thereby repeat the operation for designating the basic elements $X_{ij}$ and the supplementary elements $\chi_{nij}$. When the "BASIC ELEMENT SELECT" command 302 contained in the input menu 300 is picked with the mouse, a list of the basic elements such as shown in FIG. 11 is displayed. Thus, the design engineer can select desired basic elements at his or her will by correspondingly manipulating the cursor. Similarly, by picking the "SUPPLEMENTARY ELEMENT SELECT" command 303, a list of the supplementary elements such as illustrated in FIG. 12 is displayed, from which a desired one of the supplementary elements can be selected by pointing out correspondingly with the cursor.

FIG. 24 shows an evaluated element definition window 310 which contains the individual elements for which the works are defined and inputted by the design engineer.

In place of the method of defining the elements for evaluation through dialogical interaction as described above, there may be adopted an evaluation-destined element estimating unit 39 shown FIG. 3.

In the following, description will be made of an evaluation-destined element estimating processing concerning the attachability/assemblability evaluation of the processing of the evaluation-destined element estimating unit 39.

A part attaching or assembling sequence which is considered reasonable is established. In this conjunction, let's assume, by way of example only, that three parts ①, ② and ③ are to be attached and assembled into an article or product. In that case, there are conceivable as many as six assembling sequences in total, as is illustrated in FIG. 26A. Under the circumstances, the assembling sequence which are considered to be irrational in the light of the elimination rules shown in FIG. 25 are excluded, as a result of which there may be screened out two variants of the assembling sequence such as illustrated in FIG. 26B. In more general terms, in the case of a product or an article which requires n parts for the assembling thereof, there are conceivable a number of possible assembling sequences, which number corresponds to factorial of n. Accordingly, when the assemblability evaluation scores are to be determined for all of these assembling sequences to thereby determine the sequence having gained the highest evaluation score as the most rational assembling method, execution of the evaluation processings requires an intolerably enormous amount of time, particularly when the product of concern is constituted by several ten or several hundred parts, because then a large number of the assembling sequences have to be examined. For this reason, there are established the rules such as shown in FIG. 25 for the purpose of decreasing or screening the assembling sequences so that the number of the assembling sequences which are to undergo the evaluation processing can significantly be decreased to thereby reduce the time taken for the arithmetic operations or calculations involved in the evaluation. The assembling sequence reduction rules such as exemplified by those illustrated in FIG. 25 may be stored as knowledges of so-called production rules, as is conventionally adopted in the field of the artificial intelligence technology, wherein the rules are referred to for eliminating or excluding the assembling sequences which contradict the rules in respect to the conditions concerning the properties of the constituent parts, relations to the other part upon joining and the like.

Figure 27:
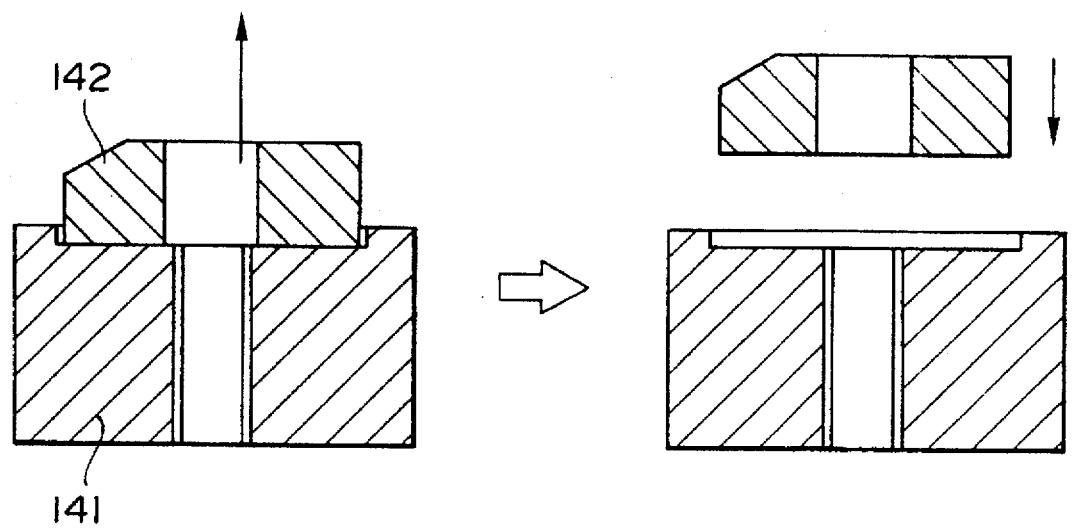
FIG. 27 is a view illustrating a processing method for designating an assembling method or procedure.

In succession to the step of selecting the assembling sequences which can ensure a high rationality, each of the assembling sequences is automatically evaluated by examining the processes or operations involved in attaching the parts on a part-by-part basis in such a manner as illustrated in FIG. 27. To this end, advantage is taken of the fact that a part attaching procedure is essentially equivalent to the reversal of a corresponding part detaching procedure. More specifically, in the case of the example illustrated in FIG. 27, automatic evaluation for the attaching operation of an i-th part 142 may be realized without incurring any problem in practical applications by finding out from the drawing data supplied from the CAD processor and showing the state in which the parts up to the i-th part inclusive have been attached such movement of the i-th part which allows that part to be detached without interfering with other part 141 (a subassembly constituted by the constituent parts up to the (i−1)-th part inclusive, which is referred to as the mounted part), whereon movement of the i-th part reverse to that involved in the detaching operation is regarded as the movement of the i-th part involved in the attaching operation. In this conjunction, it should be added that some algorithm is to be additionally prepared for coping with some exceptional structure, although description of such algorithm is omitted herein.

In conjunction with estimation of possible detaching movement of the i-th part 142 mentioned above, it is noted that when the i-th part 142 is assumed to be detached at random from the mounted part 141 with a view to checking interference between these parts, an enormous amount of time will be taken because of necessity of examining a large number of these possible detaching movements of the i-th part, rendering the checking procedure impractical. Under the circumstances, in order to automatically and rationally determine the detaching movements of the part with possible minimum arithmetic facilities, it is taught according to the invention to carry out the searching processes for finding out the movement of the part which allows detachment thereof without exerting interference to the other parts in such sequence that the basic elements (works or operations) involved in attaching the part are validated in the order of small to large elimination scores allocated to the basic elements, respectively, while manipulating the part in the direction reverse to that for attachment thereof by adopting the attachability/assemblability evaluation method described hereinbefore.

In the following, an exemplary search procedure will be described.

Figures 28A, 28B:
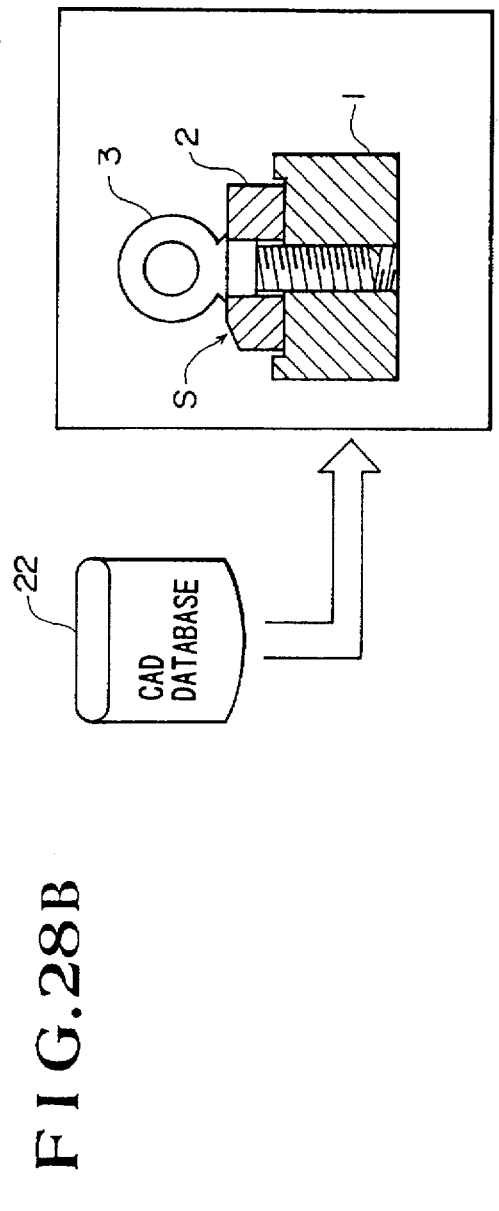
FIGS. 28A and 28B are views showing examples of part information stored in a database of a CAD system.

The design data 22 used in executing the search processing contains information concerning parts and subassembly depicted on a design drawing or drawings such as part identification numbers, names of the parts, natures of the parts (base part, screw and so forth), part identification numbers of those parts to which the parts of concern are to be connected, connecting conditions (surface contact, screwwise fitting, bonding, etc.), geometric information representing shapes and sizes of the parts, position information and so forth. Examples of the design data are illustrated in FIGS. 28A and 28B.

Figure 29:
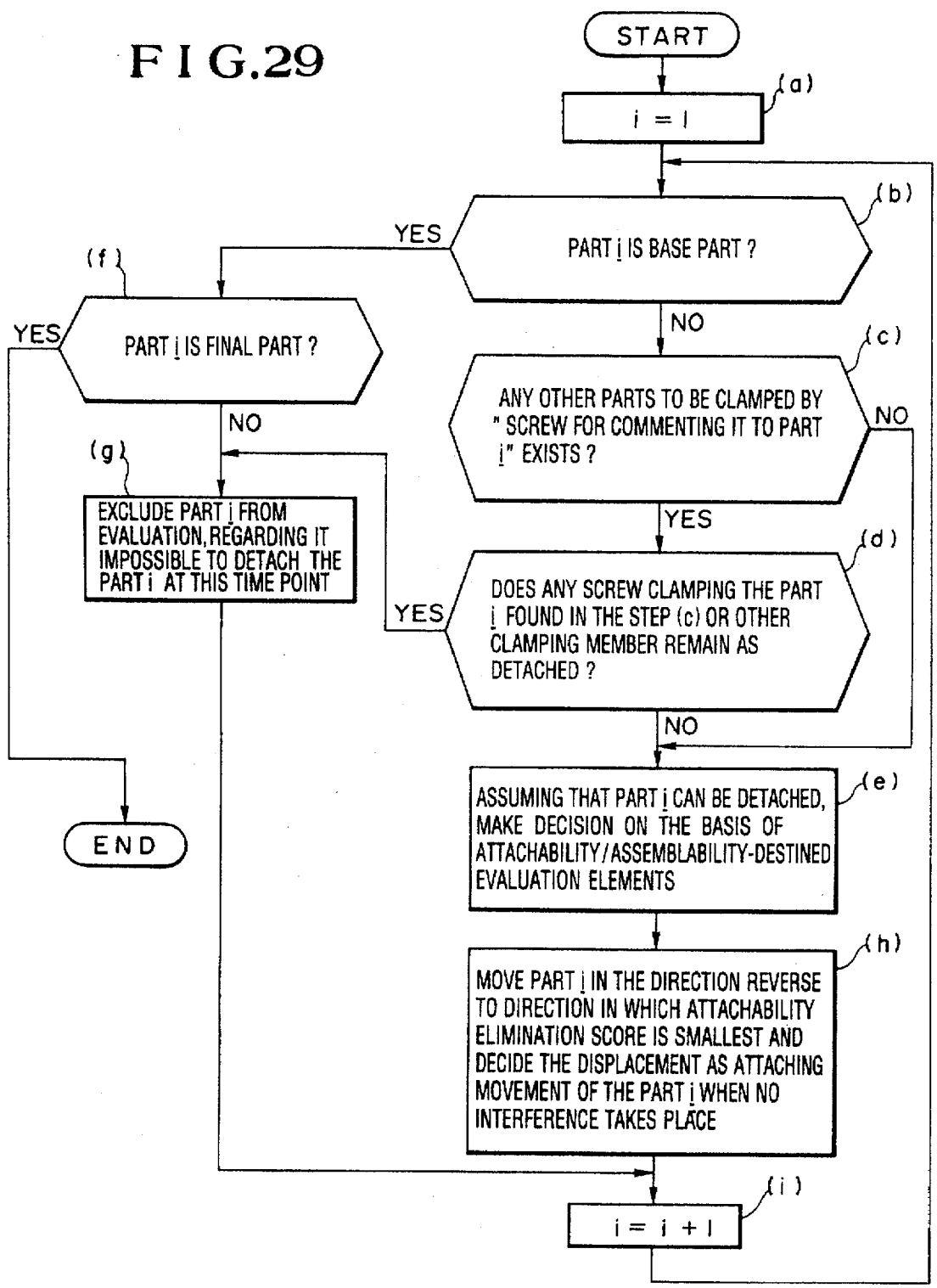
FIG. 29 is a view illustrating a procedure for searching a disassembling or detaching sequence of high rationality.

Now, a search procedure will be described by referring to FIG. 29.

In the first place, it is checked for all the parts on a part-by-part basis whether or not the part is a detachable part by reference to the rules "a basic part is generally undetachable" and "a clamped part can not be detached in precedence to screws or clamping parts by which the clamped part is attached", whereon the unworkable detachment sequences are eliminated. See steps (a) to (g) shown in FIG. 9. Subsequently, for the detachment sequences which are not excluded, the directions in which the parts are moved for detachment are found out in a step (h). In this step (h), a part i may be moved by a predetermined distance (e.g. a distance equal to a maximum length of the part i) in the upward direction which is reverse to the basic element "ATTACHMENT BY DOWNWARD MOVEMENT" (↓) which has the smallest elimination score among the basic elements shown in FIG. 4, to thereby check by making use of interference check function of the CAD processor whether or not the movement of the part i interferes with any other part. When no interference takes place, the attachment direction of the part i is decided as the downward movement (↓). If otherwise, the part i is checked as to the basic element "ATTACHMENT BY HORIZONTAL MOVEMENT" (→) which has the second smallest elimination score by moving the part i in the horizontal direction to thereby confirm whether or not interference with other part takes place. In this case, however, the moving direction may vary over a range of 360° in a horizontal plane. Accordingly, searches are conducted sequentially in the directions parallel to profile lines of contact surfaces of the parts.

Through the procedures described above, the direction in which the part i can be detached without interference with other part is found out, wherein the corresponding basic elements such as the attachment by downward movement, attachment by horizontal movement, etc., are used for calculating the evaluation score.

For each of the attachability/assemblability procedures screened out in this manner, the basic element data (basic elimination score) and supplementary element data (supplementary coefficient) both concerning the attachability or assemblability evaluation are read out from the storage 36, whereon attachability/assemblability evaluation index is calculated for each of the attachment processes. Subsequently, the attachment process having the highest attachability evaluation index value as calculated is decided to be the optimal attachment process.

As will be appreciated from the foregoing, the most rational assembling sequence can be determined for a product composed of n parts through the steps mentioned below.

(1) Possible assembling sequences are sorted out by consulting the elimination rules from a number of the assembling sequences which is factorial of n.
(2) For the assembling sequences thus selected, operations or methods which allow the parts to be detached from a finished product or article without interfering with the other parts sequentially starting from the part attached finally are searched, whereon the detaching operations are sequenced in the descending order of the attachability elimination scores of the works involved in attaching the parts which are performed with movements of the parts reverse to those involved in the detaching operations.
(3) For the disassembling sequences as determined which permit the detachment up to the part attached finally, the assemblability evaluation scores are determined for the assembling sequences which are reverse to the disassembling sequences.
(4) The assembling sequence gaining the highest assemblability evaluation score is decided to be the most rational assembling sequence or operation.

The evaluation-destined element estimating unit 39 is activated by picking a "EVALUATION-DESTINED ELEMENT ESTIMATE" command 306 displayed in the input menu 300 to thereby determine sequentially the evaluation-destined elements of the rational work procedure by referencing the design data 22 via the input unit 33, whereon the evaluation-destined element data are supplied to the part workability evaluation unit 40 and the article manufacturability evaluation unit 41, while receiving the results of arithmetic determinations of the evaluation indexes from the part workability evaluation unit 40 and the article manufacturability evaluation unit 41 to thereby decide the evaluation-destined element data having the high evaluation index indicating the highest evaluation score as the optimal data and display the evaluation-destined element data on a "EVALUATION-DESTINED ELEMENT DEFINE" window 310 (which is equivalent to the evaluation-destined element definitions window).

Next, description will be made of the functions of the part workability evaluation unit 40, the article manufacturability evaluation unit 41 and the optimal design plan selection/determination unit 42 shown in FIG. 3.

After defining the evaluation-destined elements (i.e., the basic elements to undergo the evaluation) or estimating them with the aid of the evaluation-destined element estimating unit, the designer can activate the part workability evaluation unit 40, the article manufacturability evaluation unit 41 and the optimal design plan selection/determination unit 42 sequentially by picking the "DESIGN EVALUATE" command 307 appearing within the input menu 300 shown in FIG. 24.

The part workability evaluation unit 40 requests the designer to determine the part standard. In response to the input of the part standard by the design engineer, the part workability evaluation unit 40 arithmetically determine the part elimination scores $e_i$, part workability evaluation score $E_i$, estimated working cost $C_i$ and others in accordance with the expressions (13), (7) and (10), by way of example.

On the other hand, the article manufacturability evaluation unit 41 requests the designer to determine the article standard. In response to the input of the article standard by the designer, the article manufacturability evaluation unit 41 arithmetically determines the article elimination score e, the article workability evaluation score E, the estimated working cost C and others in accordance with the expressions (17), (15) and (19), by way of example.

The results of the arithmetic operations performed by the part workability evaluation unit 40 and the article manufacturability evaluation unit 41 are displayed on the display unit 24 via the display control unit 34 in such a manner as illustrated in FIG. 15.

For the purpose of comparison, the designer may define a plurality of objects for evaluation. More specifically, the "DESIGN EVALUATION" command 307 may be activated for a plurality of objects for evaluation such as an evaluation-destined element definition ①, an evaluation-destined element definition ②, the results of the evaluation-destined element estimation and the like.

In this case, the arithmetic operations mentioned previously are performed on each of the objects for evaluation by the part workability evaluation unit 40 and the article manufacturability evaluation unit 41, respectively, whereon the optimal design plan selection/determination unit 42 is activated.

In the optimal design plan selection/determination unit 42, the article workability evaluation score E and the estimated working cost C and others are derived from the results of the arithmetic operations performed on a plurality of objects for evaluation to be compared with one another, as a result of which the object for evaluation having gained the highest article workability evaluation score E is decided as the best or optimal design plan. In this conjunction, a table for comparison such as shown in FIG. 30 is displayed on the display unit 24. In the case of the example illustrated in FIG. 30, "STRUCTURE 3" having gained the highest article assemblability evaluation score is displayed distinctly as the best or optimal design plan by changing the color for display.

According to the teachings of the present invention, it is possible to evaluate effectively the manufacturability, inspectability, transportability, salability, installability, usability (easiness of use, operability, maintenance capability, etc. through procedures similar to those described hereinbefore in conjunction with the exemplary embodiment by applying the invention to the works such as manufacturing work, inspection work, transportation work, sales activity, installation work, use, maintenance work, etc.

As can be appreciated from the foregoing, according to the invention, the degrees of easiness of works involved in handling parts or articles can be evaluated (a) at an earlier stage of design development,
(b) easily without need for abundant experiences,
(c) in the form quantitatively understandable by any one in respect to satisfactoriness of design structure, materials and others in addition to the time required for the work and the cost involved in the work and the processing. Accordingly, the design engineer himself or herself can evaluate and improve his or her design at an early stage of design development. Further, a design of high quality in respect to the easy workability can be realized within a relatively short time.

It is claimed:

1. A designed object workability evaluating system for evaluating quantitatively at a stage of defining an article whether a structure of the article as designed can be realized with easy work in a manufacturing stage, for thereby selectively determining a best structure from a plurality of design plans through comparative evaluation thereof, comprising:

a client machine section including guide information generating means for generating information for guiding operations of a user, input means for allowing the user to input commands and data, and display control means for displaying on a display unit said guide information and results of evaluations performed by said system; and a server machine section including registering means for registering in storage means evaluation elements defined by the user, storage means for storing information to be used in evaluation processing, index calculating means for calculating indexes indicating degrees of difficulty/easiness of work involved in realizing the evaluation elements already registered in said storage means, evaluation element estimating means for estimating the evaluation elements to be performed on parts comprising an article given by a design plan subjected to evaluation, part workability evaluation means for evaluating ease of work to be performed on the parts, article workability evaluation means for evaluating ease of work involved in realizing said article, and best design plan selection/determination means for selectively determining a best structure from a plurality of design plans through comparative evaluation thereof;

wherein said system is selectively comprised of one client machine section and one server machine section or a plurality of client machine sections and one server machine section interconnected by a communication network.

2. The designed object workability evaluating system according to claim 1, wherein said guide information generating means generates at least one of:

first guide information for allowing the user to selectively make definition of new evaluation elements or to perform an operation for correcting the registered evaluation element(s) on the basis of the registered evaluation element displayed on said display unit;

second guide information for displaying on said display unit standard conditions of other evaluation elements which have influence on working costs involved in the work to be performed on one registered evaluation element which concerns the user or working time required for the work to be performed on said one registered evaluation element in order to guide the user in inputting one of a working cost or a working time required for the work for performing said one evaluation element on a standard article; and third guide information for indicating to the user a procedure for inputting evaluation elements to be realized at the manufacturing stage on the individual parts comprising the article given by said design plan subjected to evaluation and selectively commanding one of the evaluation or alternatively a procedure for inputting design data of the object for evaluation from a computer-aided design system and commanding the evaluation.

3. The designed object workability evaluating system according to claim 1, wherein said input means serves as means for receiving data and commands inputted by the user or design data supplied from a computer-aided design system.

4. The designed object workability evaluating system according to claim 1, wherein said storage means stores said evaluation elements, the indexes indicating the degrees of difficulty/easiness of said works, real costs and real time involved with the works performed on the evaluation elements while establishing correspondence relations among them.

5. The designed object workability evaluating system according to claim 1, wherein said registering means serves as means for selectively registering evaluation elements newly defined by the user in said storage means or alternatively correcting the registered evaluation element of which correction is commanded by the user and again selectively registering the corrected evaluation element or alternatively registering real costs and real time involved in the works performed on said evaluation elements, respectively.

6. The designed object workability evaluating system according to claim 1, wherein said index calculating means calculates indexes indicating degrees of difficulty/easiness of the works involved in realizing said registered evaluation elements on a standard article on the basis of either one of data concerning real costs or real time involved in said works as inputted by the user.

7. The designed object workability evaluating system according to claim 1, wherein said evaluation element estimating means comprises means for estimating the evaluation elements to be realized in the manufacturing stage on the individual parts comprising the article given by the design plan subjected to evaluation on a part-by-part basis on a basis of commands inputted by the user and design data available from the computer-aided design system.

8. The designed object workability evaluating system according to claim 1, wherein said part workability evaluation means selectively reads out indexes indicating degrees of difficulty/easiness of works registered in said storage means in correspondence to the registered evaluation elements on a basis of said evaluation elements to be performed on said individual parts as inputted by the user or alternatively generated by said evaluation element estimating means, to thereby calculate part workability evaluation scores indicating degrees of easiness of work to be performed on the individual parts comprising the article given by said design plan.

9. The designed object workability evaluating system according to claim 1, wherein said article workability evaluation means selectively reads out the indexes indicating degrees of difficulty/easiness of works registered in said storage means in correspondence to the registered evaluation elements basis of said basis of said evaluation elements to be performed on said individual parts inputted by the user or alternatively generated by said evaluation element estimating means, to thereby calculate article workability evaluation scores indicating degrees of ease of work to be performed on the article given by said design plan.

10. The designed object workability evaluating system according to claim 1, wherein said best design plan selection/determination means compares article workability evaluation scores of said plurality of design plans to thereby selectively determine a structure of the design plan having a highest evaluation score.

11. The designed object workability evaluating system according to claim 1, wherein said display control means outputs guide information generated by the guide information generating means, results of the selective determination, part workability evaluation scores of each of the parts and the article workability evaluation score for the article for display on said display unit.

12. A designed object workability evaluating system for evaluating quantitatively at a stage of designing an article whether a structure of the article as designed can be realized with easy work in a manufacturing stage for thereby selectively determining a best structure from a plurality of design plans through comparative evaluation thereof, comprising:

a client machine section including guide information generating means for generating information for guiding operations of a user, input means for allowing the user to input commands and data and display control means for display on a display unit said guide information and results of evaluations performed by said system; and a server machine section including registering means for registering in storage means evaluation elements defined by the user, storage means for storing information to be used in evaluation processing, index calculating means for calculating indexes indicating degrees of difficulty/easiness of work involved in realizing the evaluation elements already registered in said storage means, evaluation element estimating means for estimating the evaluation elements to be performed on parts comprising an article given by a design plan subjected to evaluation, part workability evaluation means for evaluating ease of work to be performed on the parts, article workability evaluation means for evaluating ease of work involved in realizing said article, and best design plan selection/determination means for selectively determining a best structure on a basis of comparative evaluation of a plurality of design plans;

wherein said client machine section, said server machine section and a computer-aided design system cooperate to comprise an integral structure of said designed object workability evaluating system.

13. A designed object workability evaluating method for evaluating quantitatively at a stage of designing an article whether a structure of the article as designed can be realized with easy work in a manufacturing stage with the aid of a computer system, comprising:

registration processing for registration in the computer system of an evaluation processing for making evaluations as to ease of work to be performed on an article subjected to evaluation, said registration processing including the steps of:

(I) classifying a plurality of statuses for basic elements of which parts comprising said article that are expected to be subjected to evaluation and inputting though input means at least one value of working costs and working time expected to be involved in the work for processing the part in a standard condition for realizing said basic elements on said part of standard condition together with identification symbols of said basic elements, respectively, while establishing a correspondence between said values and said identification symbols for registration in a storage means;

(ii) classifying plural kinds of status factors which said parts are expected to have in addition to said basic elements and which influence the working costs and working time involved in realization of the basic elements, respectively, into supplementary elements, classifying each of said supplementary elements into one of more statuses, inputting through said input means at least one value of working costs and working time involved in the work to performed so that the part in said standard condition is formed in statuses of the supplementary elements as classified, respectively, to thereby register said supplementary elements in said storage means together with identification symbols of the supplementary element while establishing correspondences between said values and said symbols, respectively;

(iii) determining from said registered basic elements one basic element exhibiting a predetermined status serving as a standard of a standard element while determining one of the statuses classified for each of the registered supplementary elements as a supplementary standard;

(iv) comparing values of working costs or working time of said individual basic elements with reference to a corresponding value of the working cost or working time of said standard element to thereby determine basic elimination scores serving as indexes which indicate a degree of difficulty/easiness of work to be performed on said basic elements, respectively and storing said basic elimination scores while establishing correspondences between said basic elimination scores and the identification symbols, respectively, of the basic individual elements registered in said storage means; and (v) comparing values of the working costs or working time involved by said classified statuses of said supplementary elements with the corresponding value of the working costs or the working time involved by supplementary standards of said individual supplementary elements to thereby determine supplementary coefficients serving as indexes which indicate the degree of difficulty/easiness of the work involved by the classified statuses of each of said supplementary elements, and storing said supplementary coefficients in said storage means in correspondence with the identification symbols, respectively, of the individual supplementary elements registered in said storage means;

said processing for evaluating the degree of ease of work on the article subject to evaluation including the steps of:

(vi) inputting through the input means identification symbols representing said basic element indicating work to be performed on individual parts of said article in a manufacturing stage and said supplementary elements on a part-by-part basis;

(vii) referencing said storage means on a basis of the identification symbols representing, respectively, the basic elements indicating the works to be performed on the individual parts as inputted and supplementary elements therefor, to thereby read out the corresponding elimination scores and the supplementary coefficients;

(viii) arithmetically determining on the basis of said basic elimination scores and said supplementary coefficients as read out of those part elimination scores serving as indexes indicating the degree of difficulty/easiness of work to be performed on the individual parts, respectively, by selectively comparing the working cost or the working time of the part standard for the individual parts with the working cost or working time expected to be required by the work to be performed on the individual parts;

said part standard having one of said standard elements while said supplementary elements each represent a maximum size and a mass, respectively, having sizes corresponding to said parts, respectively;

(ix) determining part workability evaluation scores representing indexes indicating degrees of ease of the work to be performed on each of the parts by subtracting the value of said part elimination score, respectively, from a predetermined standard value;

(x) determining arithmetically from said calculated part elimination score and an article elimination score which represents an index indicating degree of difficulty/easiness of works to be performed on the article subjected to evaluation by comparing a working cost or a working time of an article standard corresponding to said article subjected to evaluation with a working cost or a working time of said article subjected to evaluation obtained by totaling at least one of the working costs and the working time for the parts comprising said article subjected to evaluation, respectively;

said article standard representing a standard for the article subjected to the evaluation which is assumed to comprise a combination of said part standards;

(xi) determining an article workability evaluation score representing a degree of ease of work to be performed on the article subjected to evaluation by subtracting a value of said article elimination score from a predetermined standard value;

(xii) outputting at least one of said part workability evaluation score and said article workability evaluation score through a display unit;

(xiii) determining either a necessity or unnecessity of improvement of the article subjected to evaluation and a most optimal design plan by comparing a magnitude of the article workability evaluation score of the article subjected to evaluation with that of an article workability evaluation score of an alternative determined through a similar procedure.

14. The design object workability evaluating method according to claim 13, wherein in said step (iv), index calculating means reads out at least one value of the working costs and the working time of the individual basic elements from said storage means and reads out at least one value of corresponding working cost and working time for said standard element registered in said storage means to thereby determine the basic elimination score serving as an index indicating the degree of difficulty/easiness of the work for the basic element on the basis of a value of a ratio or difference between the value of said standard element as read out and the value of the basic element as read out and registering said basic elimination scores in said storage means, said processing being repeatedly executed for the individual basic elements, respectively;

while in said step (v), said index calculating means reads out from said storage means at least one value of the working cost and the working time in one of the classified statuses of the the individual supplementary elements while reading out at least one value of the corresponding working cost and working time for the supplementary standard registered in said storage means, to thereby determine the supplementary coefficient serving as the index indicating the degree of difficulty/easiness of the work for one of the classified statuses of said supplementary elements, and registers said supplementary coefficient in said storage means, said processing being repetitively executed for the classified statuses of all the supplementary elements, respectively.

15. The designed object workability evaluating method according to claim 13, wherein said step (ix) is replaced by a step of determining the part workability evaluation scores representing the indexes indicating degrees of ease of the work to be done on the individual parts, respectively, by adding the values of said part elimination scores to the predetermined standard value;

while step (xi) is replaced by a step of determining the article workability evaluation scores representing the indexes indicating degrees of ease of the work to be done on the article subjected to evaluation by adding the value of said article elimination score to the predetermined standard value.

* * * * *